(12) United States Patent
Lee et al.

(10) Patent No.: US 8,942,042 B2
(45) Date of Patent: Jan. 27, 2015

(54) NONVOLATILE MEMORY DEVICE AND A METHOD OF ADJUSTING A THRESHOLD VOLTAGE OF A GROUND SELECTION TRANSISTOR THEREOF

(71) Applicant: Samsung Electronics Co., Ltd., Gyeonggi-do (KR)

(72) Inventors: Ae-Jeong Lee, Chungbuk (KR); Bongyong Lee, Gyeonggi-do (KR); Dongchan Kim, Seoul (KR); Jaesung Sim, Gyeonggi-do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 77 days.

(21) Appl. No.: 13/772,868

(22) Filed: Feb. 21, 2013

(65) Prior Publication Data

US 2013/0215679 A1      Aug. 22, 2013

(30) Foreign Application Priority Data

Feb. 21, 2012  (KR) .......................... 10-2012-0017413

(51) Int. Cl.
  *G11C 16/04*   (2006.01)
  *G11C 16/10*   (2006.01)
  *H01L 27/115*  (2006.01)
  *G11C 16/34*   (2006.01)

(52) U.S. Cl.
  CPC ............ *G11C 16/10* (2013.01); *G11C 16/0483* (2013.01); *G11C 16/3409* (2013.01); *H01L 27/1157* (2013.01); *H01L 27/11582* (2013.01)
  USPC ................ 365/185.17; 365/185.2; 365/210.1; 365/185.11; 365/185.05

(58) Field of Classification Search
  CPC ............... G11C 16/0483; G11C 16/10; G11C 16/3418; G11C 16/26; H01L 27/115
  USPC .................. 365/185.17, 185.2, 210.1, 185.11, 365/185.05
  See application file for complete search history.

(56) References Cited

U.S. PATENT DOCUMENTS

| | | | |
|---|---|---|---|
| 7,006,379 B2 | 2/2006 | Noguchi et al. | |
| 7,092,038 B2 | 8/2006 | Shih et al. | |
| 7,177,192 B2 | 2/2007 | Yoon et al. | |
| 7,509,588 B2 | 3/2009 | Van Os et al. | |
| 7,839,691 B2 | 11/2010 | Chae et al. | |
| 8,027,194 B2 | 9/2011 | Lee et al. | |
| 8,053,829 B2 | 11/2011 | Kang et al. | |
| 8,084,805 B2 | 12/2011 | Shim et al. | |
| 8,263,623 B2 | 9/2012 | Jones et al. | |
| 2007/0106836 A1 | 5/2007 | Lee et al. | |
| 2009/0190401 A1* | 7/2009 | Jeon et al. ................ | 365/185.05 |

(Continued)

FOREIGN PATENT DOCUMENTS

| | | |
|---|---|---|
| KR | 1020060120889 | 11/2006 |
| KR | 1020080015554 | 2/2008 |
| KR | 1020090106909 | 10/2009 |

*Primary Examiner* — Jason Lappas
(74) *Attorney, Agent, or Firm* — F. Chau & Associates, LLC

(57) ABSTRACT

A method of adjusting a threshold voltage of a ground selection transistor in a nonvolatile memory device includes providing a first voltage to a gate of a first ground selection transistor in a read operation and providing a second voltage to a gate of a second ground selection transistor in the read operation. The nonvolatile memory device includes at least one string, the string having string selection transistors, memory cells and the first and second ground selection transistors connected in series and stacked on a substrate.

15 Claims, 24 Drawing Sheets

(56) References Cited

U.S. PATENT DOCUMENTS

| | | |
|---|---|---|
| 2009/0250745 A1 | 10/2009 | Kim |
| 2009/0287879 A1 | 11/2009 | Oh et al. |
| 2009/0310415 A1 | 12/2009 | Jin et al. |
| 2010/0062715 A1 | 3/2010 | Kim et al. |
| 2010/0082890 A1 | 4/2010 | Heo et al. |
| 2010/0117141 A1 | 5/2010 | Shin et al. |
| 2010/0128522 A1 | 5/2010 | Choi et al. |
| 2010/0213527 A1 | 8/2010 | Shim et al. |
| 2010/0224929 A1 | 9/2010 | Jeong et al. |
| 2010/0306583 A1 | 12/2010 | Kim et al. |
| 2010/0309237 A1 | 12/2010 | Roh |
| 2010/0315325 A1 | 12/2010 | Hwang |
| 2010/0315875 A1 | 12/2010 | Kim et al. |
| 2010/0322000 A1 | 12/2010 | Shim et al. |
| 2011/0013458 A1 | 1/2011 | Seol |
| 2011/0018036 A1 | 1/2011 | Hwang et al. |

\* cited by examiner

NONVOLATILE MEMORY DEVICE AND A METHOD OF ADJUSTING A THRESHOLD VOLTAGE OF A GROUND SELECTION TRANSISTOR THEREOF

CROSS-REFERENCE TO RELATED APPLICATION

This U.S. non-provisional application claims priority under 35 U.S.C. §119 to Korean Patent Application No. 10-2012-0017413, filed Feb. 21, 2012, in the Korean Intellectual Property Office, the disclosure of which is incorporated by reference herein in its entirety.

BACKGROUND

1. Technical Field

The inventive concept relates to a nonvolatile memory device and a method of adjusting a threshold voltage of a ground selection transistor thereof.

2. Discussion of the Related Art

A semiconductor memory device may be volatile or nonvolatile. A nonvolatile memory device can retain stored data even when not powered. Data stored in the nonvolatile memory device may be permanent or reprogrammed, depending on the fabrication technology used. Nonvolatile memory devices are generally used for user data, program and microcode storage in a wide variety of applications in the computer, avionics, telecommunications, and consumer electronics industries.

SUMMARY

An exemplary embodiment of the inventive concept provides a method of adjusting a threshold voltage of a ground selection transistor in a nonvolatile memory device, the method comprising providing a first voltage to a gate of a first ground selection transistor in a read operation; and providing a second voltage to a gate of a second ground selection transistor in the read operation, wherein the nonvolatile memory device includes at least one string, the string having string selection transistors, memory cells and the first and second ground selection transistors connected in series and stacked on a substrate.

In an exemplary embodiment of the inventive concept, the second ground selection transistor is formed on the substrate and the first ground selection transistor is formed on the second ground selection transistor.

In an exemplary embodiment of the inventive concept, the first and second ground selection transistors are formed by ion implantation.

In an exemplary embodiment of the inventive concept, the first voltage is higher than a read pass voltage.

In an exemplary embodiment of the inventive concept, the first voltage is lower than a maximum value of a program voltage.

In an exemplary embodiment of the inventive concept, a read operation of a selected memory cell is performed by providing a pre-charge voltage to a bit line connected to the string, the read pass voltage to a string selection line connected with a gate of a selected one of the string selection transistors, a read voltage to a word line connected with the selected memory cell, the read pass voltage to word lines connected with unselected word lines of the word lines, the first voltage to a first ground selection line connected with the gate of the first ground selection transistor, and the second voltage to a second ground selection line connected with the gate of the second ground selection transistor.

In an exemplary embodiment of the inventive concept, the second voltage is higher than the read pass voltage.

In an exemplary embodiment of the inventive concept, the second voltage is the read pass voltage.

In an exemplary embodiment of the inventive concept, a read operation of the selected memory cell is repeated.

In an exemplary embodiment of the inventive concept, voltages applied to a bit line connected to the string, string selection lines connected with gates of the string selection lines, and word lines connected with the memory cells have a don't care state, and the second voltage is higher than a read pass voltage and lower than a program voltage.

In an exemplary embodiment of the inventive concept, voltages applied to a bit line connected to the string, string selection lines connected with gates of the string selection lines, and word lines connected with the memory cells have a don't care state, and the second voltage is a read pass voltage.

In an exemplary embodiment of the inventive concept, the method further comprises determining whether a threshold voltage of the first ground selection transistor is adjusted.

An exemplary embodiment of the inventive concept provides a nonvolatile memory device which comprises a memory cell array having a plurality of memory blocks, at least one of the memory blocks including at least one string having string selection transistors, memory cells, and first and second ground selection transistors connected in series and formed on a substrate; a read/write circuit configured to read data from or write data to the memory cell array; an address decoder configured to generate a block selection signal in response to an address; a block gating circuit configured to select one of the plurality of memory blocks in response to the block selection signal; and control logic configured to control the read/write circuit, the address decoder, and the block gating circuit, wherein the control logic adjusts a threshold voltage of at least one of the first and second ground selection transistors by providing a first voltage to a gate of the first ground selection transistor and a second voltage to a gate of the second ground selection transistor in a read operation.

In an exemplary embodiment of the inventive concept, the nonvolatile memory device further comprises at least one first dummy cell connected between the string selection transistors and the memory cells; and at least one second dummy cell connected between the memory cells and the first and second ground selection transistors.

In an exemplary embodiment of the inventive concept, the first ground selection transistor has the same structure as at least one of the memory cells and the second ground selection transistor has a different structure than the first ground selection transistor.

An exemplary embodiment of the inventive concept provides a method of adjusting a threshold voltage of a selection transistor in a nonvolatile memory device, the method comprising providing a first voltage to a first selection transistor in a read period; and providing a second voltage to a second selection transistor in the read period, wherein the first and second selection transistors are included in a memory cell string.

The first and second selection transistors include ground selection transistors.

The first and second selection transistors include string selection transistors.

The first voltage is greater than the second voltage.

The first and second voltages are the same.

BRIEF DESCRIPTION OF THE DRAWINGS

The above and other features of the inventive concept will become more apparent by describing in detail exemplary embodiments thereof with reference to the accompanying drawings.

DETAILED DESCRIPTION OF THE EMBODIMENTS

Figure 1:
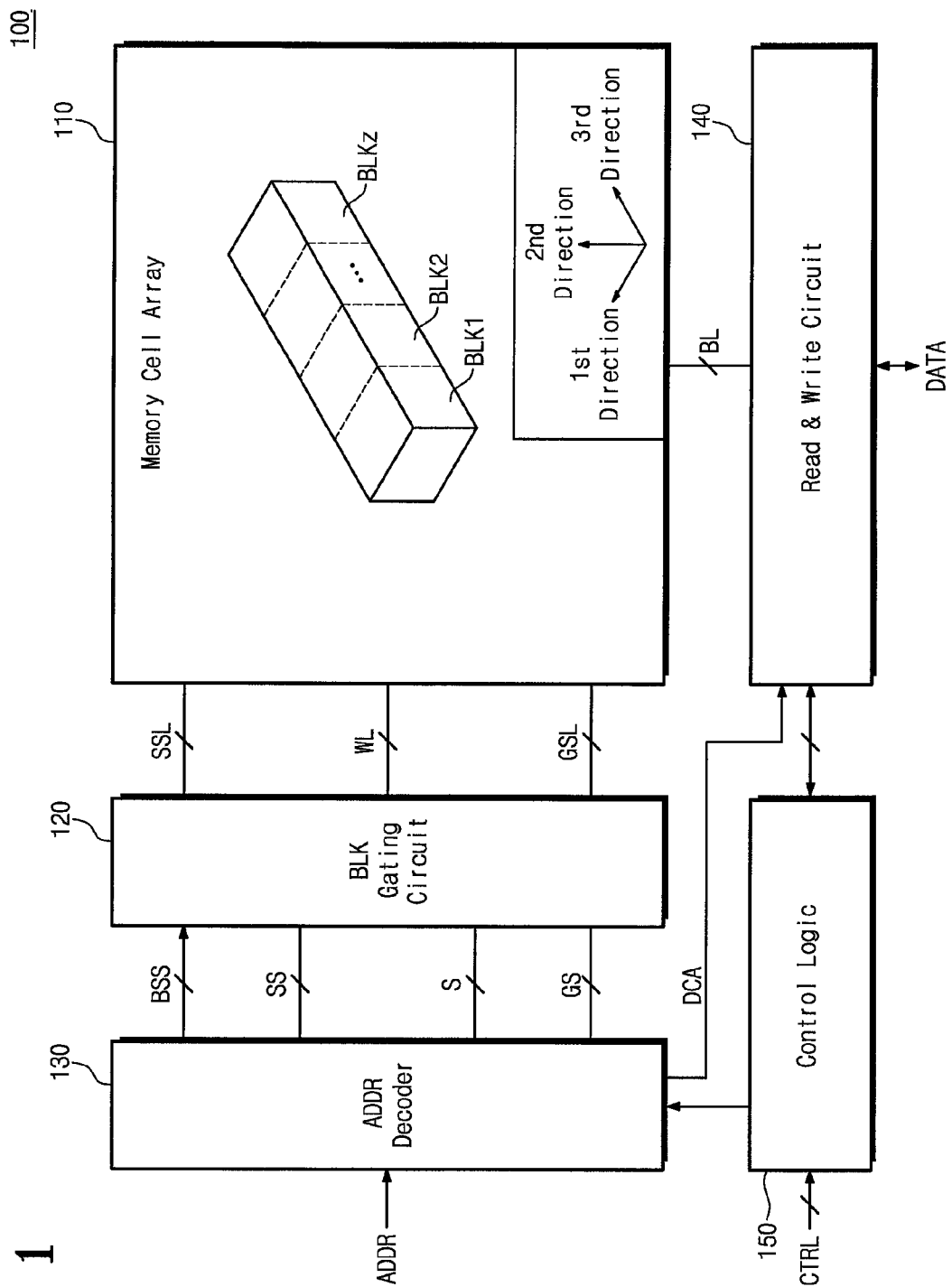
FIG. 1 is a block diagram illustrating a nonvolatile memory device according to an exemplary embodiment of the inventive concept.

Hereinafter, exemplary embodiments of the inventive concept will be described in detail with reference to the accompanying drawings. The inventive concept, however, may be embodied in various different forms, and should not be construed as being limited to the embodiments set forth herein. Like reference numerals may denote like elements throughout the attached drawings and written description.

As used herein, the singular forms "a," "an" and "the" are intended to include the plural forms as well, unless the context clearly indicates otherwise.

It will be understood that when an element or layer is referred to as being "on," "connected to," "coupled to," or "adjacent to" another element or layer, it can be directly on, connected, coupled, or adjacent to the other element or layer, or intervening elements or layers may be present.

FIG. 1 is a block diagram illustrating a nonvolatile memory device according to an exemplary embodiment of the inventive concept. Referring to FIG. 1, a nonvolatile memory device 100 may include a memory cell array 110, a block gating circuit 120, an address decoder 130, a read/write circuit 140, and control logic 150.

The memory cell array 110 may include a plurality of memory blocks BLK1 to BLKz (z being an integer of 2 or more). Herein, the memory blocks BLK1 to BLKz may constitute a structure stacked along a second direction (or a vertical direction) on a plane extending along first and third directions.

Each of the memory blocks BLK1 to BLKz may include a plurality of vertical strings extending in a direction perpendicular to a substrate. Each vertical string may include a plurality of memory cells stacked along a direction perpendicular to the substrate. In other words, the memory cells may be provided on the substrate along rows and columns, and may be stacked in a direction perpendicular to the substrate to form a three-dimensional structure. In an exemplary embodiment of the inventive concept, the memory cell array 110 may include a plurality of memory cells each storing one or more bits of data.

A more detailed description of the memory blocks BLK1 to BLKz is disclosed in U.S. Patent Application Publication Nos. 2009-0310415, 2010-0078701, 2010-0117141, 2010-0140685, 2010-0213527, 2010-0224929, 2010-0315875, 2010-0322000, 2011-0013458, and 2011-0018036, the disclosures of which are incorporated by reference herein in their entireties.

The block gating circuit 120 may be coupled with the memory cell array 110 via string selection lines SSL, word lines WL, and ground selection lines GSL. The block gating circuit 120 may be coupled with the address decoder 130 via string lines SS, selection lines S, and ground lines GS. The block gating circuit 120 may receive a block selection signal BSS from the address decoder 130.

The block gating circuit 120 may select a memory block of the memory cell array 110 in response to the block selection signal BBS. The block gating circuit 120 may electrically connect string selection lines SSL, word lines WL, and a ground selection line(s) of the selected memory block with the string lines SS, the selection lines 5, and the ground line(s) GS.

The address decoder 130 may be coupled with the memory cell array 110 via the word lines WL, the string selection lines SSL, and the ground selection lines GSL. The address decoder 130 may be configured to operate responsive to the control of the control logic 150. The address decoder 130 may receive an address ADDR from an external device.

The address decoder 130 may be configured to decode a row address of the input address ADDR. The address decoder 130 may be configured to select a word line corresponding to a decoded row address of the word lines WL. The address decoder 130 may be configured to select a string selection line and a ground selection line corresponding to the decoded row address of the string selection lines SSL and the ground selection lines GSL.

The address decoder 130 may be configured to decode a column address of the input address ADDR. The address decoder 130 may provide the decoded column address DCA to the read/write circuit 140.

In an exemplary embodiment of the inventive concept, the address decoder 130 may include a row decoder for decoding a row address, a column decoder for decoding a column address, and an address buffer for storing the input address ADDR.

The read/write circuit 140 may be coupled with the memory cell array 110 via bit lines BL. The read/write circuit 140 may be configured to exchange data DATA with an external device. The read/write circuit 140 may operate responsive to the control of the control logic 150. The read/write circuit 140 may select bit lines BL in response to the decoded column address DCA provided from the address decoder 130.

In an exemplary embodiment of the inventive concept, the read/write circuit 140 may receive data DATA from an external device to write it in the memory cell array 110.

The read/write circuit 140 may read data DATA from the memory cell array 110 to output it to the external device. The read/write circuit 140 may read data from a first storage area of the memory cell array 110 to write it in a second storage area thereof. In other words, the read/write circuit 140 may perform a copy-back operation.

In an exemplary embodiment of the inventive concept, the read/write circuit 140 may include elements such as a page buffer (or, a page register), a column selecting circuit, a data buffer, and the like. In an exemplary embodiment of the inventive concept, the read/write circuit 140 may include elements such as a sense amplifier, a write driver, a column selecting circuit, a data buffer, and the like.

The control logic 150 may be coupled with the address decoder 130 and the read/write circuit 140. The control logic 150 may be configured to control an overall operation of the nonvolatile memory device 100. In particular, the control logic 150 may be configured to adjust a threshold voltage of a transistor (e.g., a ground selection transistor) connected with a ground selection line (e.g., GSL) using at least one bias condition. For example, the control logic 150 may adjust a threshold voltage of a ground selection transistor via gate disturbance or gate voltage stress by adaptively adjusting bias conditions for a read operation (hereinafter, referred to as a read bias condition).

The nonvolatile memory device 100 according to an exemplary embodiment of the inventive concept may adjust a threshold voltage of a ground selection transistor by adjusting at least one read bias condition.

Figure 2:
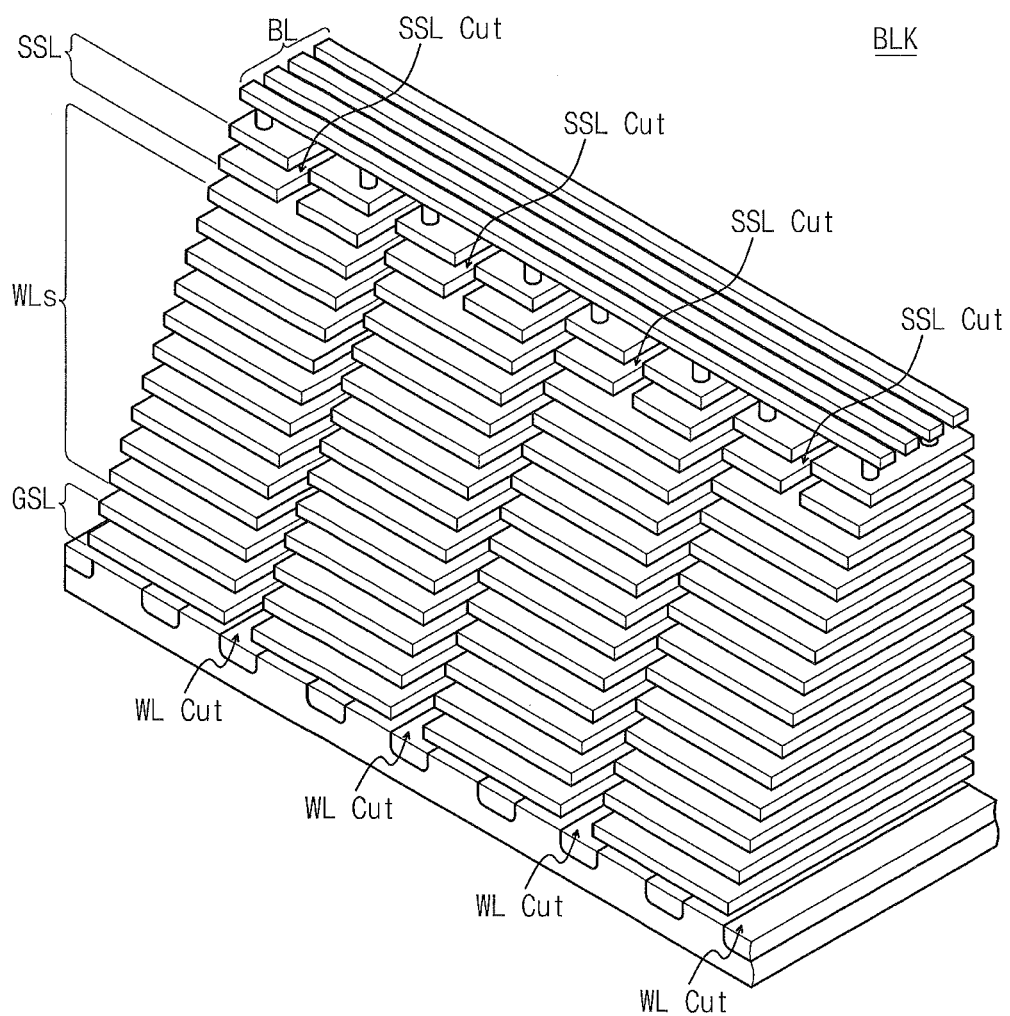
FIG. 2 is a diagram illustrating a memory block in FIG. 1 according to an exemplary embodiment of the inventive concept.

FIG. 2 is a diagram illustrating a memory block in FIG. 1 according to an exemplary embodiment of the inventive concept. Referring to FIG. 2, four sub blocks may be formed on a substrate. However, the inventive concept is not limited thereto and more than four sub blocks may be formed on the substrate. Each of the sub blocks may be formed by stacking at least one ground selection line GSL, a plurality of word lines WL, and at least one string selection line SSL on the substrate and separating a resultant structure by word line cuts WL Cut. Herein, at least one string selection line SSL may be separated by a string selection line cut SSL Cut. Although not illustrated in FIG. 2, each of the word line cuts WL Cut may include a common source line CSL. Common source lines included in the word line cuts WL Cut may be connected in common. Bit lines BL may extend across the sub blocks and be in contact with string selection lines SSL of the sub blocks.

In FIG. 2, a structure between word line cuts WL Cut may be assumed to be a sub block. However, the inventive concept is not limited thereto. For example, a structure between a word line cut WL Cut and a string selection line cut SSL Cut can be defined as a sub block.

A block according to an exemplary embodiment of the inventive concept may have a merged word line structure in that two word lines are merged into one.

Figure 3:
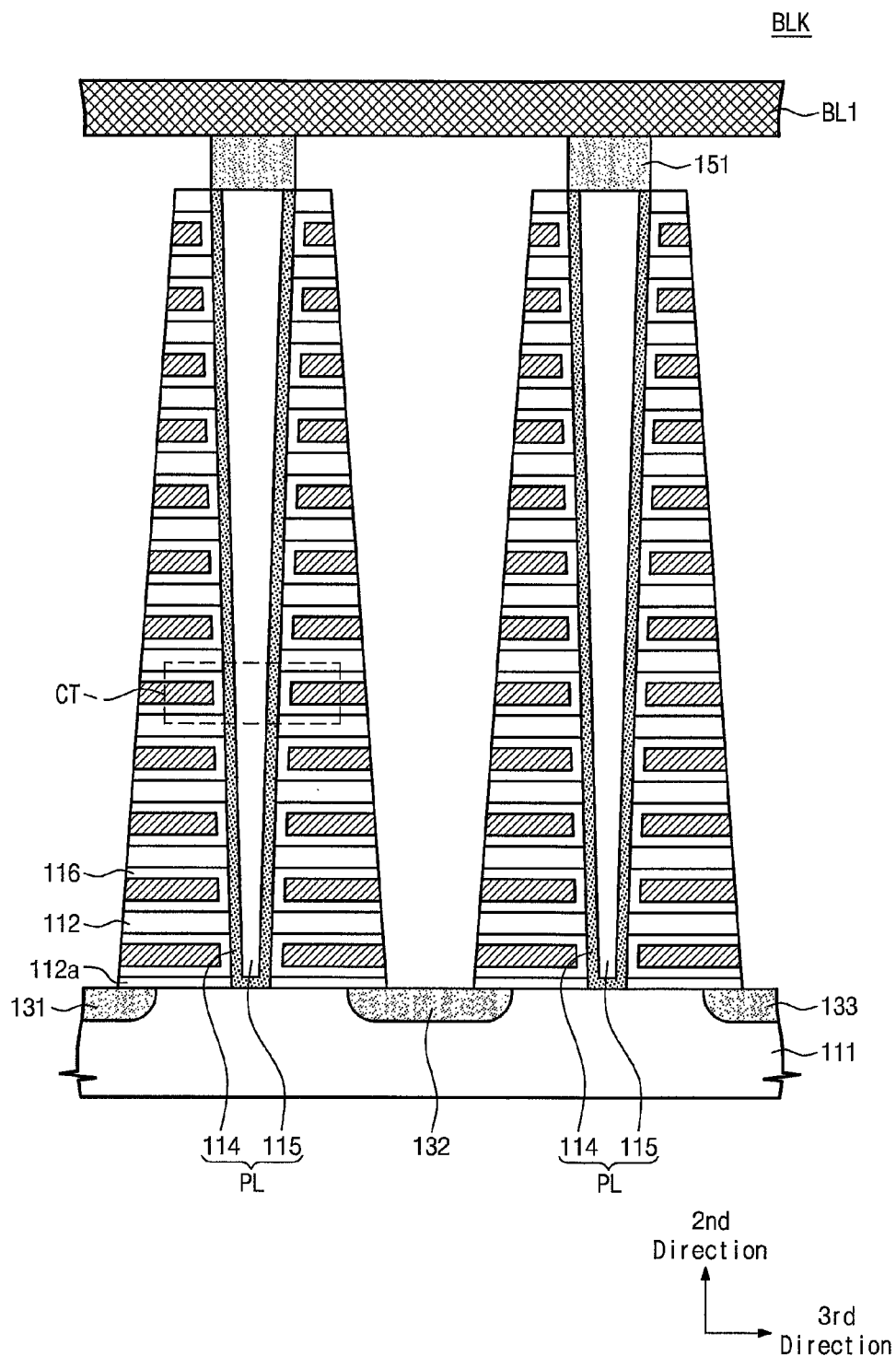
FIG. 3 is a cross-sectional view of a memory block in FIG. 2 according to an exemplary embodiment of the inventive concept.

FIG. 3 is a cross-sectional view of a memory block BLK in FIG. 2 according to an exemplary embodiment of the inventive concept. Referring to FIG. 3, a substrate 111 may be provided. The substrate 111 may be a well having a first conductivity type, for example. The substrate 111 may be a p-well in which a Group III element such as boron is injected. The substrate 111 may be a pocket p-well which is provided within an n-well. Hereinafter, it is assumed that the substrate 111 is a p-well (or, a pocket p-well). However, the substrate 111 is not limited to the p-type.

A plurality of doping regions 131 to 133 extending along the first direction may be provided in the substrate 111. The doping regions 131 to 133 may be spaced apart from one another along a third direction. Hereinafter, the doping regions 131 to 133 may be referred to as a first doping region 131, a second doping region 132, and a third doping region 132.

The first to third doping regions 131 to 133 may have a second conductivity type different from that of the substrate 111. For example, the first to third doping regions 131 to 133 may be n-type. Hereinafter, it is assumed that the first to third doping regions 131 to 133 are n-type. However, the doping regions 131 to 133 are not limited to the n-type.

Between two adjacent regions of the first to third doping regions 131 to 133, a plurality of insulation materials 112 and 112a may be sequentially provided on the substrate 111 along a second direction (e.g., a direction perpendicular to the substrate 111). The insulation materials 112 and 112a may be spaced apart along the second direction. The insulation materials 112 and 112a may extend along the first direction. For example, the insulation materials 112 and 112a may include an insulation material such as a semiconductor oxide film.

The insulation material 112a contacting with the substrate 111 may be thinner in thickness than other insulation materials 112.

Between two adjacent regions of the first to third doping regions 131 to 133, a plurality of pillars PL may be sequentially arranged along the first direction to penetrate the plurality of insulation materials 112 and 112a along the second direction. For example, the pillars PL may contact with the substrate 111 through the insulation materials 112 and 112a.

In an exemplary embodiment of the inventive concept, the pillars PL may be formed of a plurality of layers, respectively. Each of the pillars PL may include a channel film 114 and an inner material 115. In each of the pillars PL, the channel film 114 may be formed to surround the inner material 115.

The channel films 114 may include a semiconductor material (e.g., silicon) having the first conductivity type. For example, the channel films 114 may include a semiconductor material (e.g., silicon) having the same conductivity type as the substrate 111. Hereinafter, it is assumed that the channel films 114 include p-type silicon. However, the inventive concept is not limited thereto. For example, the channel films 114 can include an intrinsic semiconductor being a nonconductor.

The inner materials 115 may include an insulation material. For example, the inner materials 115 may include an insulation material such as silicon oxide. Alternatively, the inner materials 115 may include an air gap.

Between two adjacent regions of the first to third doping regions 131 to 133, information storage films 116 may be provided on exposed surfaces of the insulation materials 112 and 112a and the pillars PL. In an exemplary embodiment of the inventive concept, a thickness of the information storage film 116 may be smaller than a distance between the insulation materials 112 and 112a. A width of the information storage film 116 may be in inverse proportion to a depth of a pillar PL. For example, the shallower the depth of the pillar PL, the wider the width of the information storage film 116.

Between two adjacent regions of the first to third doping regions 131 to 133, conductive materials may be provided on exposed surfaces of the information storage films 116. Conductive materials extending along the first direction may be provided between an information storage film provided on a lower surface of an upper insulation material of the insulation materials 112 and 112a and an information storage film provided on an upper surface of a lower insulation material of the insulation materials 112 and 112a. In an exemplary embodiment of the inventive concept, the conductive materials may include a metallic conductive material. The conductive materials may include a nonmetallic conductive material such as polysilicon.

In an exemplary embodiment of the inventive concept, information storage films 116 provided on an upper surface of an insulation material placed at the uppermost layer from among the insulation materials 112 and 112a can be removed. In an exemplary embodiment of the inventive concept, information storage films provided at sides opposite of the pillars PL from among sides of the insulation materials 112 and 112a can be removed.

A plurality of drains 151 may be provided on the plurality of pillars PL, respectively. The drains 151 may include a semiconductor material (e.g., silicon) having the second conductivity type, for example. The drains 151 may include an n-type semiconductor material (e.g., silicon). Hereinafter, it is assumed that the drains 151 include n-type silicon. However, the inventive concept is not limited thereto. The drains 151 can be extended to the upside of the channel films 114 of the pillars PL.

Bit lines BL extending in the third direction may be provided on the drains 151 to be spaced apart from one another along the first direction. FIG. 3 shows a first bit line BL1. The bit lines BL may be coupled with the drains 151. In an exemplary embodiment of the inventive concept, the drains 151 and the bit lines BL may be connected via contact plugs (not shown). The bit lines BL may include a metallic conductive material. Alternatively, the bit lines BL may include a nonmetallic conductive material such as polysilicon.

The plurality of pillars PL may form vertical strings together with the information storage films 116 and the plurality of conductive materials. Each of the pillars PL may form a vertical string with information storage films 116 and adjacent conductive materials.

Each of the vertical strings may include a plurality of cell transistors (or, memory cells) stacked in a vertical direction to the substrate 111. In FIG. 3, a dotted box CT may indicate one cell transistor.

Figure 4:
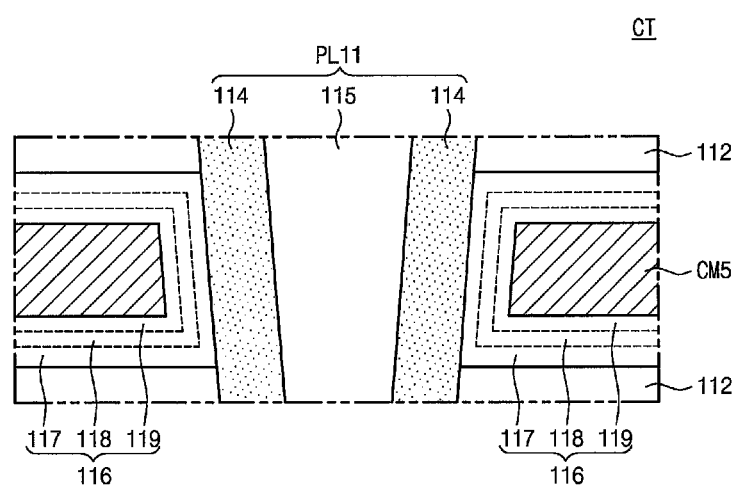
FIG. 4 is an enlarged diagram illustrating a cell transistor of FIG. 3, according to an exemplary embodiment of the inventive concept.

FIG. 4 is an enlarged diagram illustrating one of the cell transistors in FIG. 3, according to an exemplary embodiment of the inventive concept. Referring to FIGS. 3 and 4, a cell transistor CT may be formed of a pair of conductive material CM5, a pillar PL11 adjacent to the conductive materials CM5, and a pair of information storage films 116 provided between the conductive materials CM5 and the pillar PL11.

The information storage films 116 may extend to upper surfaces and lower surfaces of the conductive materials CM5 from a region between the conductive materials CM5 and the pillar PL11. Each of the information storage films 116 may include first to third sub insulation films 117, 118, and 119. In the cell transistors CT, channel films 114 of the pillars may include the same p-type silicon as a substrate 111.

The channel film 114 may act as a body of the cell transistors CT. The channel film 114 may be formed in a direction perpendicular to the substrate 111. Thus, the channel film 114 of the pillars PL may act as a vertical body of the channel film 114. Channels formed at the channel film 114 of the pillars PL may act as vertical channels.

The conductive materials may act as gates (or, control gates). The first sub insulation films 117 adjacent to the pillars PL may act as tunneling insulation films. For example, the first sub insulation films 117 adjacent to the pillars PL may include a thermal oxide film, respectively. The first sub insulation films 117 may include a silicon oxide film, respectively.

The second sub insulation films 118 may act as charge storage films. For example, the second sub insulation films 118 may act as a charge trap film, respectively. For example, the second sub insulation films 118 may include a nitride film or a metal oxide film (e.g., an aluminum oxide film, a hafnium oxide film, etc.), respectively. The second sub insulation films 118 may include a silicon nitride film.

The third sub insulation films 119 adjacent to the conductive materials may act as blocking insulation films. In an exemplary embodiment of the inventive concept, the third sub insulation films 119 may be formed of a single layer or multiple layers. The third sub insulation films 119 may be a high dielectric film (e.g., an aluminum oxide film, a hafnium oxide film, etc.) having a dielectric constant larger than those of the first and second sub insulation films 117 and 118. The third sub insulation films 119 may include a silicon oxide film, respectively.

In an exemplary embodiment of the inventive concept, the first to third sub insulation films 117 to 119 may constitute ONO (oxide-nitride-oxide). In other words, the plurality of conductive materials acting as gates (or, control gates), the third sub insulation films 119 acting as block insulation films, the second sub insulation films 118 acting as charge storage films, the first sub insulation films 117 acting as tunneling insulation films, and the channel films 114 acting as vertical bodies may constitute a plurality of cell transistors CT stacked in a direction perpendicular to the substrate 111. For example, the cell transistors CT may be a charge trap type cell transistor.

The conductive materials may extend along the first direction to be connected with the plurality of pillars. The conductive materials may constitute conductive lines interconnecting cell transistors CT of the pillars in the same row. In an exemplary embodiment of the inventive concept, the conductive materials may be used as a string selection line, a ground selection line, or a word line according to their height.

Figure 5:
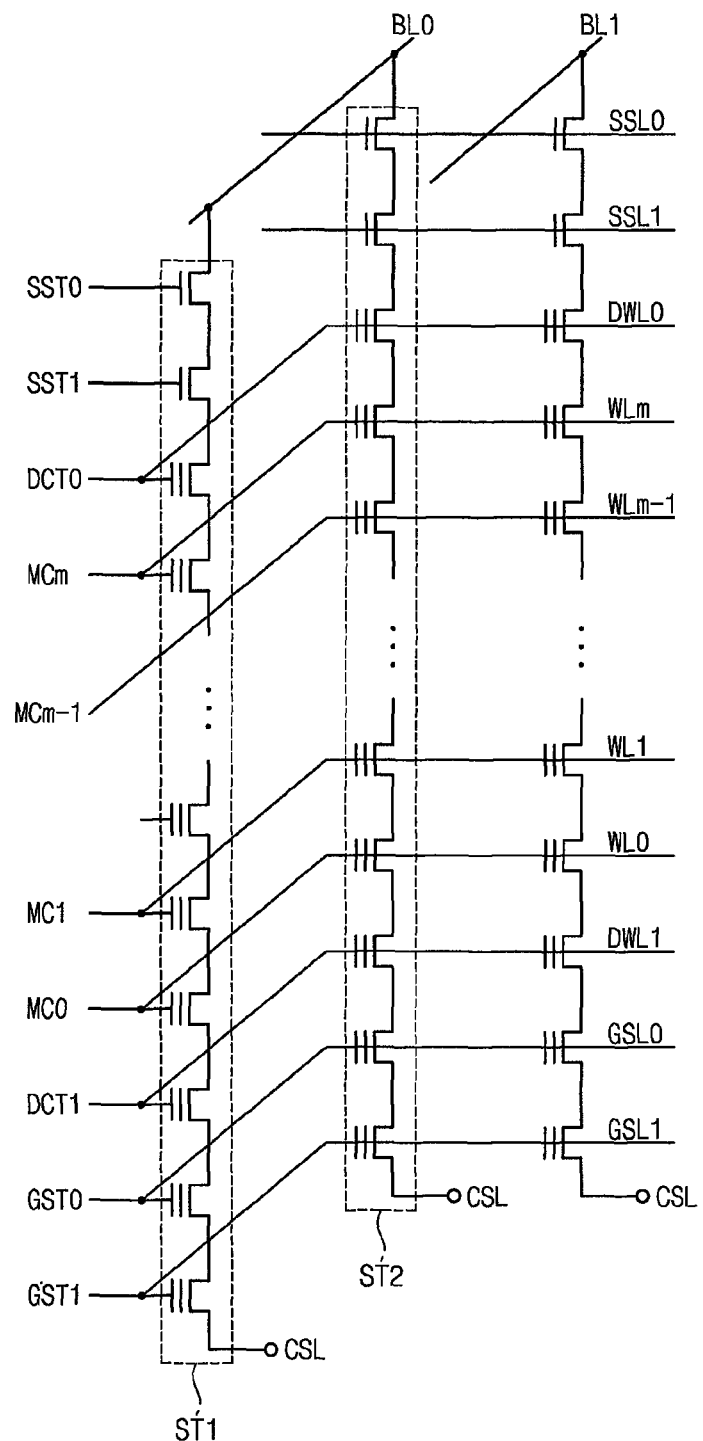
FIG. 5 is a circuit diagram illustrating an equivalent circuit of a memory block in FIG. 2, according to an exemplary embodiment of the inventive concept.

FIG. 5 is a circuit diagram illustrating an equivalent circuit of a memory block in FIG. 2, according to an exemplary embodiment of the inventive concept. Referring to FIG. 5, at least two vertical strings ST1 and ST2 may be provided between a bit line BL0 and a common source line CSL.

Each of the vertical strings ST1 and ST2 may include serially-connected string selection transistors SST0 and SST1, a first dummy cell DCT0, serially-connected memory cells MC0 to MCm, a second dummy cell DCT1, and serially-connected ground selection transistors GST0 and GST1.

FIG. 5 also shows string selection lines SSL0 and SSL1, dummy word lines DWL0 and DWL1, ground selection lines GSL0 and GSL1 and word lines WL0 to WLm.

The string selection transistors SST0 and SST1 may select one of the vertical strings ST1 and ST2. Herein, a threshold voltage of each of the string selection transistors SST0 and SST1 can be adjusted using an ion implantation process. In an exemplary embodiment of the inventive concept, a threshold voltage of each of the string selection transistors SST0 and SST1 can be adjusted by a program operation.

As will be explained later, adjusting threshold voltages of the ground selection transistors GST0 and GST1 using the ion implantation process may cause read errors. In general, the ground selection transistor GST0 formed on a substrate may have a threshold voltage below 1.0V at a first (or, pure) state.

Figure 6:
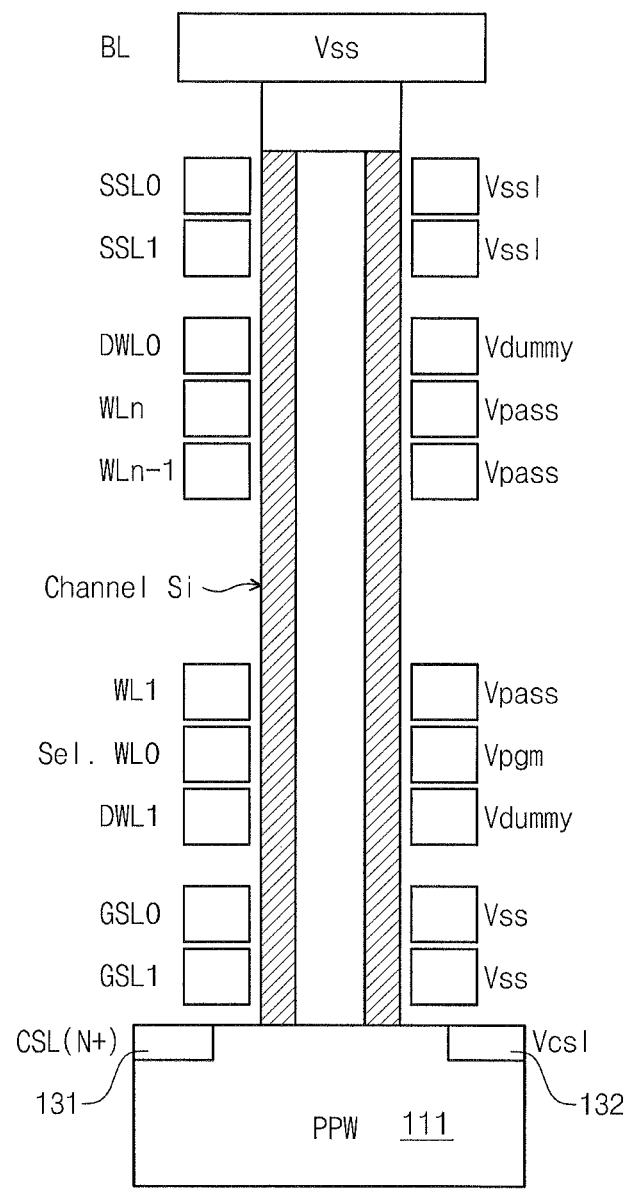
FIG. 6 is a diagram illustrating a bias condition of a program operation, according to an exemplary embodiment of the inventive concept.

FIG. 6 is a diagram illustrating a bias condition of a program operation, according to an exemplary embodiment of the inventive concept. Referring to FIG. 6, a ground voltage Vss may be applied to a selected bit line BL and ground selection lines GSL0 and GSL1, a string selection voltage Vss1 may be provided to string selection lines SSL0 and SSL1, a program voltage may be provided to a selected word line WL0, a pass voltage Vpass may be applied to unselected word lines WL1 to WLm, a dummy voltage may be applied to dummy word lines DWL0 and DWL1, and a common source voltage Vcs1 may be provided to a common source line CSL of substrate 111 which is a p-well PPW. At this time, since it is connected with the selected bit line BL, a channel of a vertical string Channel Si may be set to a ground voltage level, e.g., Vss.

Although not shown, a program bias condition for a vertical string may be equal to the above-described bias condition except that a power supply voltage Vcc is applied to an unselected bit line BL for program-inhibition. After being pre-charged up to a voltage of (Vcc-Vth) (Vth is threshold voltages of string selection transistors (SST1 and SST2 in FIG. 5)), a channel of an unselected string may be shut off by the string selection transistors SST1 and SST2. Afterwards, the shut-off channel may be boosted at a program operation.

Figure 7:
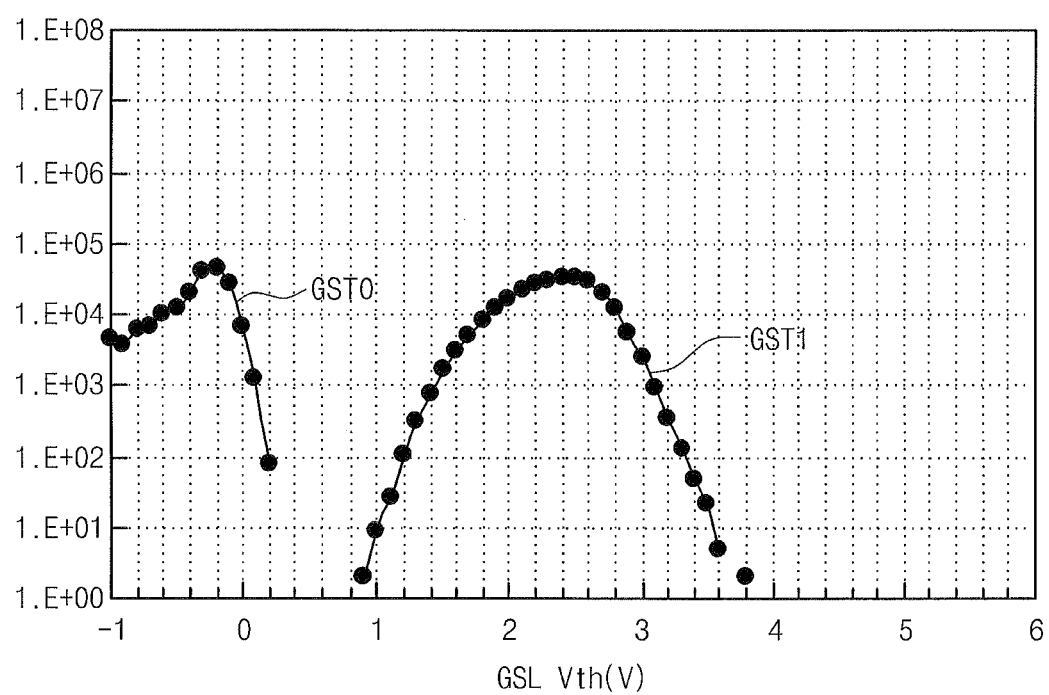
FIG. 7 is a diagram illustrating a threshold voltage distribution of ground selection transistors at a first state, according to an exemplary embodiment of the inventive concept.

FIG. 7 is a diagram illustrating a threshold voltage distribution of ground selection transistors at a first (or, pure) state, according to an exemplary embodiment of the inventive concept. Referring to FIG. 7, a first ground selection transistor GST0 may have a threshold voltage below 0V, and a second ground selection transistor GST1 may have a threshold voltage over 1V. In FIG. 7, Vth (V) represents the threshold voltage provided via a ground selection line GSL to the first and second ground selection transistors GST0 and GST1, for example.

At a program operation, when a ground voltage Vss is applied to the first ground selection transistor GST0, the first ground selection transistor GST0 may be turned on. In this case, a current may be leaked. Although a threshold voltage of the second ground selection transistor GST1 is adjusted using an ion implantation process; as illustrated in FIG. 7, threshold voltages of some (marked by a dotted line) of second ground selection transistors GST1 may be low. For this reason, a leakage path may exist. In general, a common source voltage Vcs1 higher than a predetermined value may be provided to a common source line CSL. However, in the case of the second ground selection transistor GST1, a bulk of a p-well 111 may be used as a channel of a transistor. In this case, a p-well junction of the common source line CSL may be weak, so that a leakage current exists.

A threshold voltage of a ground selection transistor (marked by a dotted line in FIG. 7) may become partially higher by increasing an ion implantation amount of the second ground selection transistor GST1. However, a threshold voltage of the remaining portion may become much higher. A threshold voltage thus increased may be close to a voltage provided to a gate of the second ground selection transistor GST1. In this case, a cell current may be reduced. In other words, a read error may be caused.

As described above, although a threshold voltage of a ground selection transistor may be adjusted using an ion implantation process, a read error may be caused.

In an exemplary embodiment of the inventive concept there may be provided a method of adjusting a threshold voltage of a ground selection transistor without a read error by using the gate disturbance or the gate voltage stress.

Figure 8:
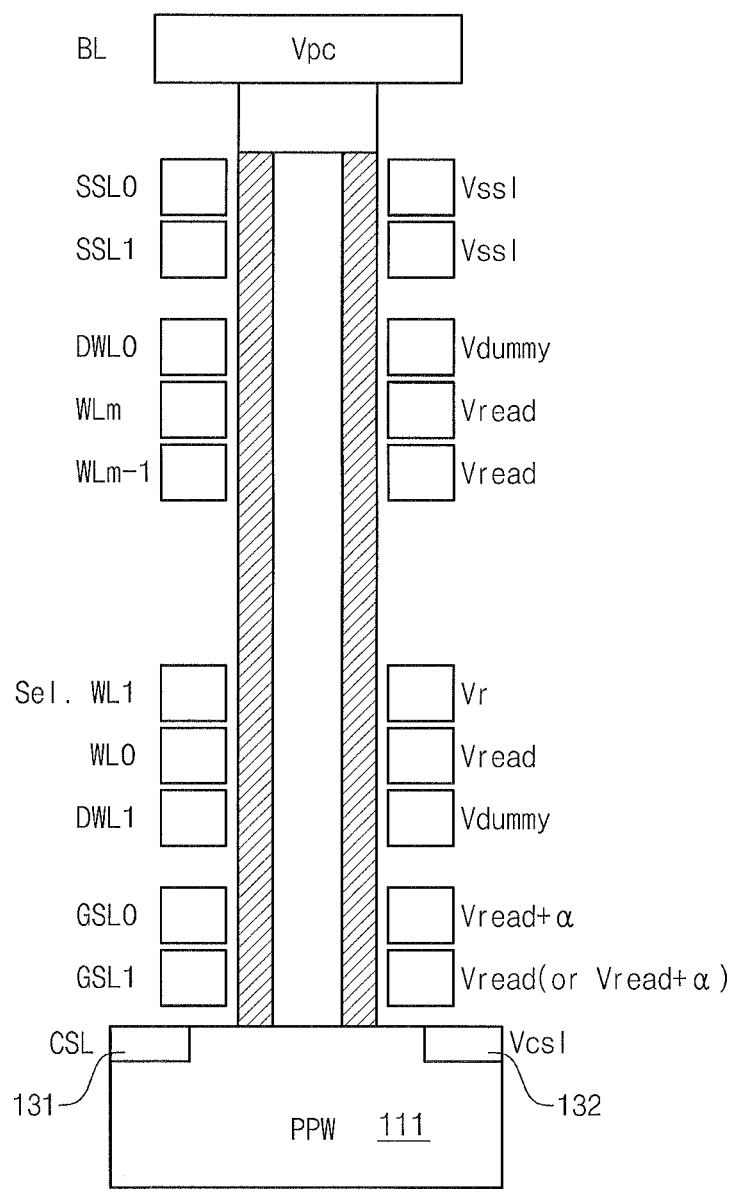
FIG. 8 is a diagram illustrating a threshold voltage of a ground selection transistor being adjusted via the gate disturbance of a read operation, according to an exemplary embodiment of the inventive concept.

FIG. 8 is a diagram illustrating a threshold voltage of a ground selection transistor being adjusted via the gate disturbance of a read operation, according to an exemplary embodiment of the inventive concept. For ease of description, an operation of reading a memory cell connected with a first word line WL0 may be illustrated in FIG. 8. Below, a bias condition for read operation (e.g., a read bias condition) will be more fully described.

A pre-charge voltage Vpc may be provided to a bit line BL, a string selection voltage Vss1 may be provided to string selection lines SSL0 and SSL1, a read voltage Vr may be provided to a selected word line WL1, and a read pass voltage Vread may be provided to unselected word lines WL0, WL2 to WLm and a dummy voltage Vdummy may be provided to dummy word lines DWL0 and DWL1. A voltage of (Vread+α) higher than the read pass voltage Vread may be provided to a first ground selection line GSL0, the read pass voltage Vread or a voltage of (Vread+α) higher than the read pass voltage Vread may be provided to a second ground selection line GSL1, and a common source voltage Vcs1 may be applied to a common source line CSL of substrate 111 which is a p-well PPW. Herein, a voltage provided to the first ground selection line GSL0 may be referred to as a first voltage, a voltage provided to the second ground selection line GSL1 may be referred to as a second voltage, and the voltage of (Vread+α) may not be higher than the program voltage Vpgm.

In an exemplary embodiment of the inventive concept, the read pass voltage Vread may be about 7V.

In an exemplary embodiment of the inventive concept, the voltage of (Vread+α) higher than the read pass voltage Vread may be generated by dividing a low voltage generated from a low voltage generator (not shown) using an e-Fuse in a trim manner.

In an exemplary embodiment of the inventive concept, the e-Fuse trim may be activated at a test operation of the nonvolatile memory device 100. In an exemplary embodiment of the inventive concept, the e-Fuse trim may be activated according to a request of a user (e.g., a reliability improvement request).

In accordance with the above description, a threshold voltage of a ground selection transistor GST0 connected with the first ground selection line GSL0 may be adjusted by providing a voltage of (Vread+α) higher than a read pass voltage Vread to the first ground selection line GSL0, in other words, using the gate disturbance.

Figure 9:
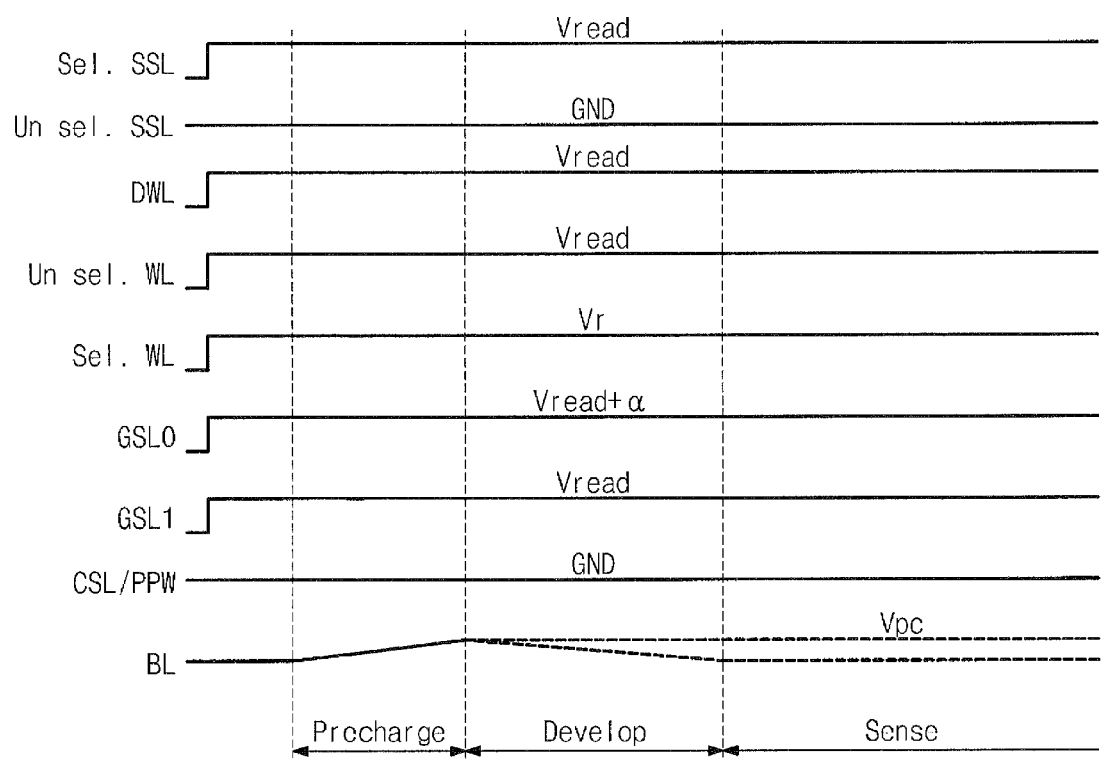
FIG. 9 is a timing diagram illustrating a bias condition providing the gate disturbance of a read operation to adjust a threshold voltage of a ground selection transistor, according to an exemplary embodiment of the inventive concept.

FIG. 9 is a timing diagram illustrating a bias condition providing the gate disturbance of a read operation to adjust a threshold voltage of a ground selection transistor, according to an exemplary embodiment of the inventive concept. Referring to FIG. 9, a read pass voltage Vread may be applied to a selected string selection line Sel. SSL, a ground voltage GND may be supplied to an unselected string selection line Un sel. SSL, the read pass voltage Vread may be provided to a dummy word line DWL, an unselected word line Un sel. WL, and a second ground selection line GSL1, a read voltage Vr may be applied to a selected word line Sel. WL, and a first voltage (Vread+α) may be provided to a first ground selection line GSL0. At this time, a common source line CSL and a p-well PPW may be grounded.

At a read operation, a bit line BL may be pre-charged with the pre-charge voltage Vpc at a pre-charge period. During a develop period, a voltage of the bit line BL may maintain the pre-charge voltage Vpc or be lowered to a ground voltage GND according to data stored at a memory cell. During a sense period, the bit line BL may have one of the pre-charge voltage Vpc and a ground voltage GND.

An exemplary embodiment of the inventive concept may adjust a threshold voltage of a ground selection transistor by providing different bias conditions to the first and second ground selection transistors.

Figure 10:
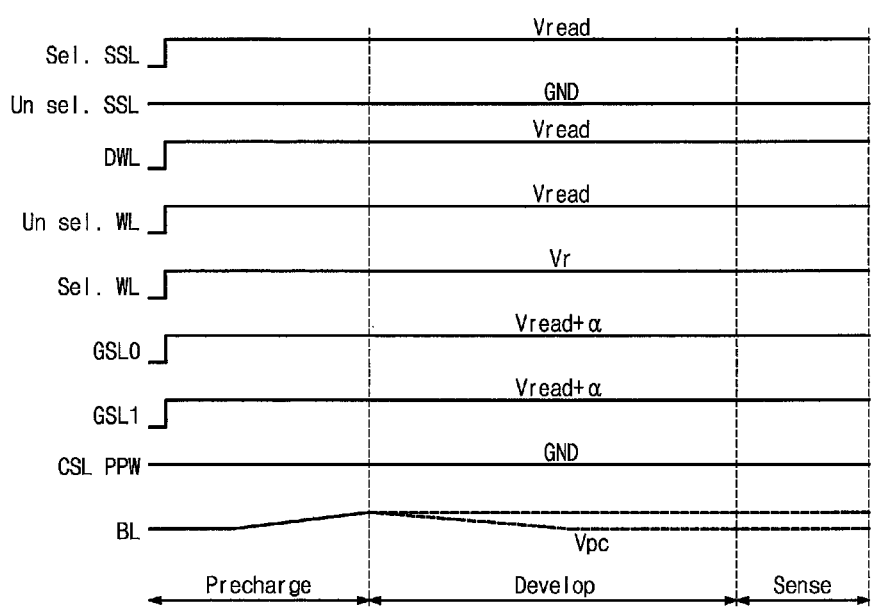
FIG. 10 is a timing diagram illustrating a bias condition providing the gate disturbance of a read operation to adjust a threshold voltage of a ground selection transistor, according to an exemplary embodiment of the inventive concept.

FIG. 10 is a timing diagram illustrating a bias condition providing the gate disturbance of a read operation to adjust a threshold voltage of a ground selection transistor, according to an exemplary embodiment of the inventive concept. A bias condition in FIG. 10 may be similar to that in FIG. 9 except that a voltage of (Vread+α) higher than a read pass voltage Vread is applied to a second ground selection line GSL1.

An exemplary embodiment of the inventive concept may adjust a threshold voltage of a ground selection transistor by providing the same bias condition to the first and second ground selection transistors.

Figure 11:
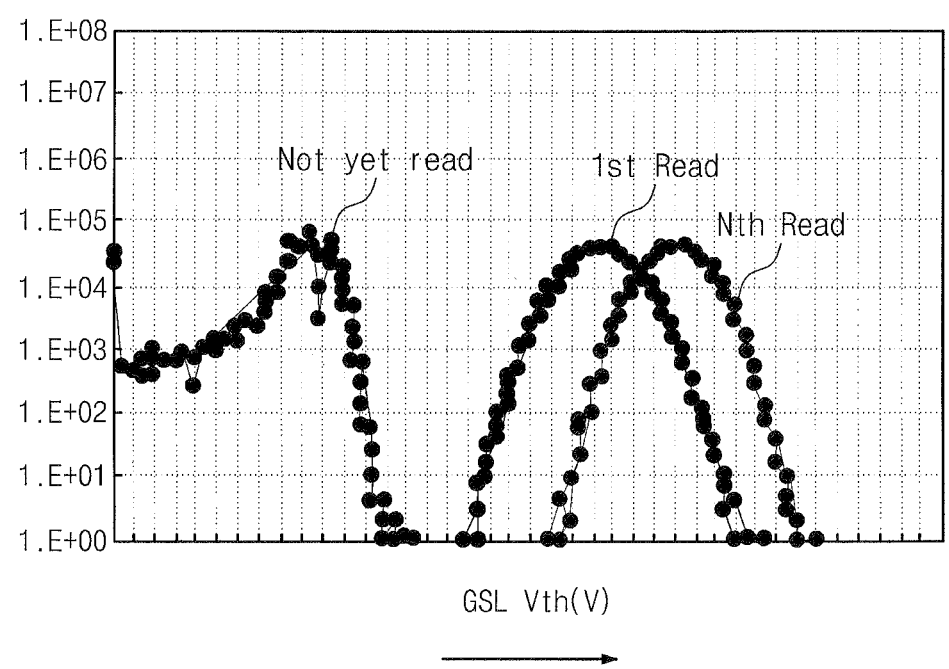
FIG. 11 is a diagram illustrating a shift of a threshold voltage of a ground selection transistor according to the gate disturbance of a read operation, according to an exemplary embodiment of the inventive concept.

FIG. 11 is a diagram illustrating a shift of a threshold voltage of a ground selection transistor according to the gate disturbance of a read operation, according to an exemplary embodiment of the inventive concept. Referring to FIG. 11, as a read operation is performed, a threshold voltage distribution may be increased.

Figure 12:
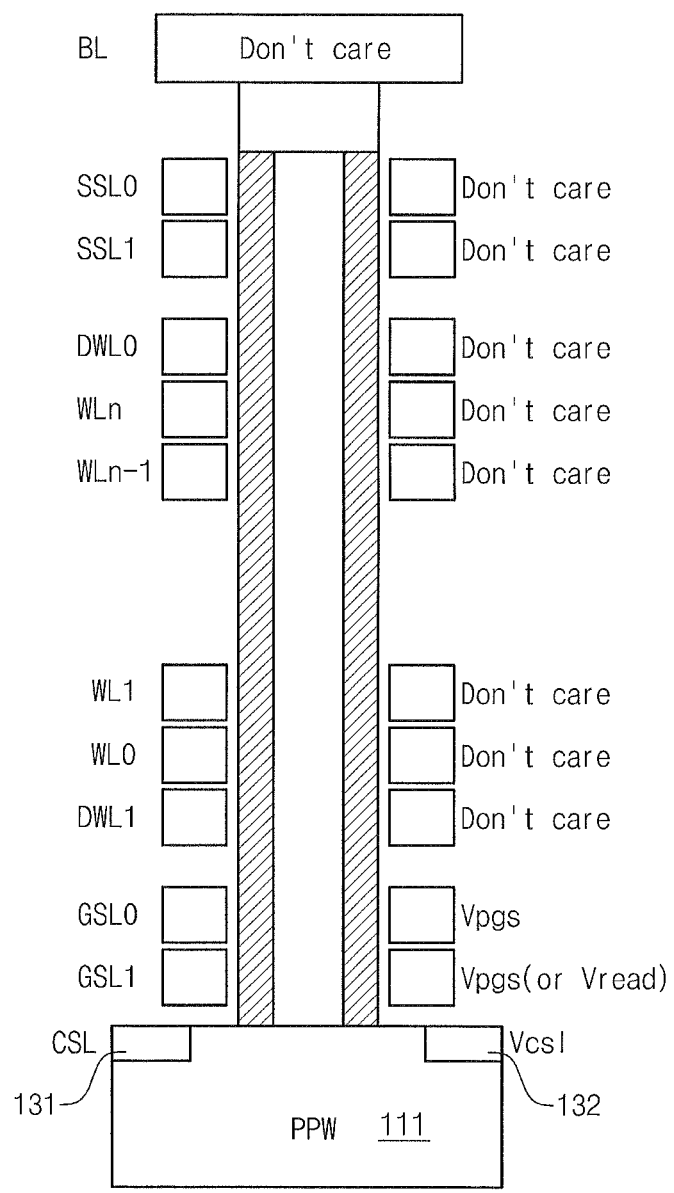
FIG. 12 is a diagram illustrating a threshold voltage of a ground selection transistor being adjusted by the gate stress of a read operation, according to an exemplary embodiment of the inventive concept.

FIG. 12 is a diagram illustrating a threshold voltage of a ground selection transistor being adjusted by the gate stress of a read operation, according to an exemplary embodiment of the inventive concept.

Referring to FIG. 12, biases of a bit line BL, string selection lines SSL0 and SSL1, word lines WL0 to WLn, and dummy word lines DWL0 and DWL1 are don't care. A common source voltage Vcs1 may be applied to a common source line CSL of substrate 111 which is a p-well PPW, a gate stress voltage Vpgs (or, a first voltage) may be applied to a first ground selection line GSL0, and the gate stress voltage Vpgs or a read pass voltage Vread may be provided to a second ground selection line GSL1. Herein, a voltage provided to the second ground selection line GSL1 may be referred to as a second voltage, and the gate stress voltage Vpgs may be higher than the read pass voltage Vread and lower than a maximum program voltage Vpgm_max.

In an exemplary embodiment of the inventive concept, the gate stress voltage Vpgs may be about 10V to about 14V.

An exemplary embodiment of the inventive concept may adjust a threshold voltage of a ground selection transistor GST0 connected with the first ground selection line GSL0 by providing the gate stress voltage Vpgs to the first ground selection line GSL0 at a read operation.

An exemplary embodiment of the inventive concept may shorten a time taken to adjust a threshold voltage of the ground selection transistor GST0 connected with the first ground selection line GSL0 by providing a gate stress voltage Vpgs to plural blocks BLK1 to BLKz at the same time.

Figure 13:
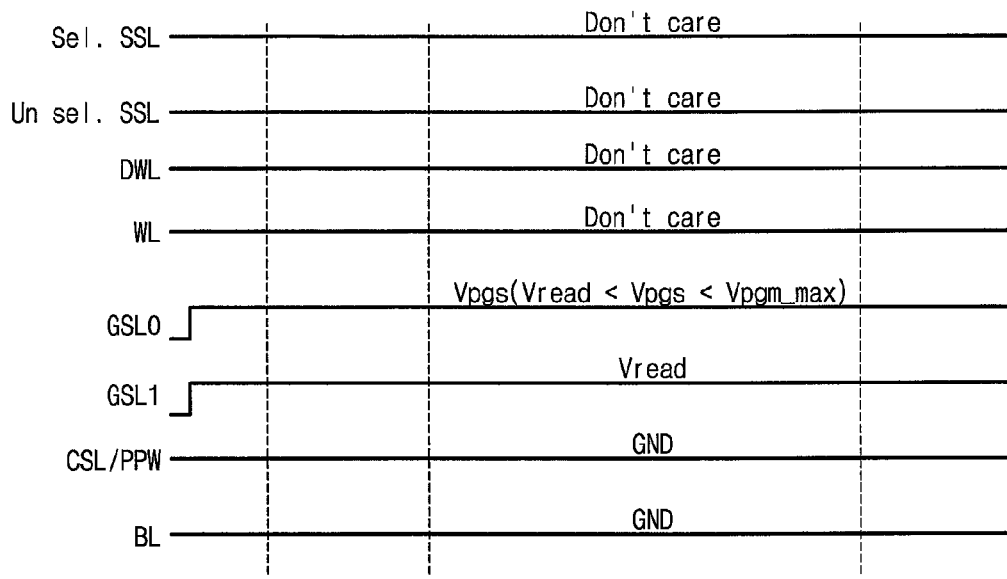
FIG. 13 is a timing diagram illustrating a bias condition providing the gate stress to adjust a threshold voltage of a ground selection transistor, according to an exemplary embodiment of the inventive concept.

FIG. 13 is a timing diagram illustrating a bias condition providing the gate stress to adjust a threshold voltage of a ground selection transistor, according to an exemplary embodiment of the inventive concept. Referring to FIG. 13, a gate stress voltage Vpgs (or, a first voltage) may be provided to a first ground selection line GSL0, a read pass voltage Vread may be applied to a second ground selection line GSL1, and a common source line CSL, a p-well PPW, and a bit line BL may be grounded. At this time, biases of a selected string selection line Sel. SSL, an unselected string selection line Un sel. SSL, a dummy word line DWL, and word lines WL are don't care.

Figure 14:
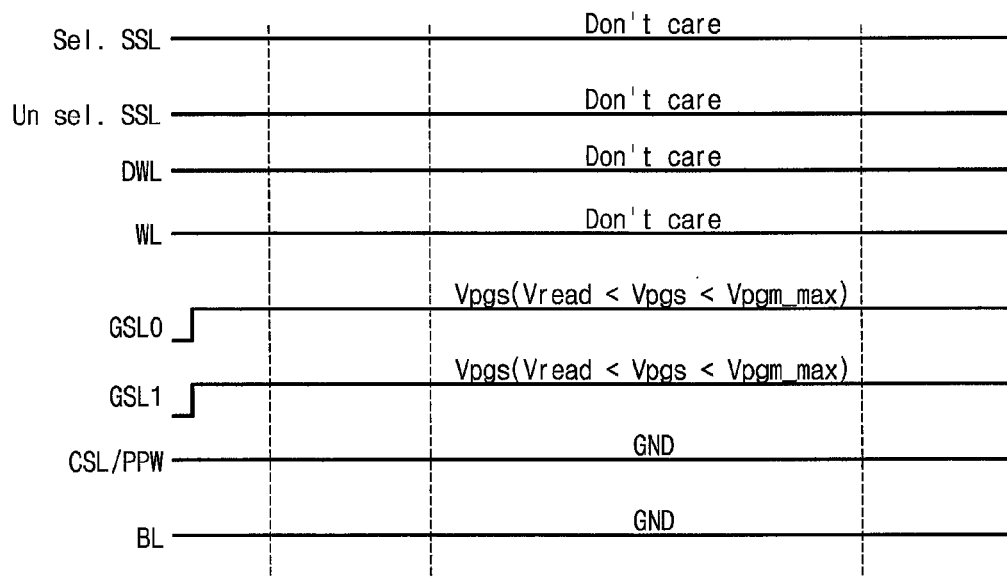
FIG. 14 is a timing diagram illustrating a bias condition providing the gate stress to adjust a threshold voltage of a ground selection transistor, according to an exemplary embodiment of the inventive concept.

FIG. 14 is a timing diagram illustrating a bias condition providing the gate stress to adjust a threshold voltage of a ground selection transistor, according to an exemplary embodiment of the inventive concept. A bias condition in FIG. 14 may be equal to that in FIG. 13 except that a gate stress voltage Vpgs is applied to a second ground selection line GSL1.

Figure 15:
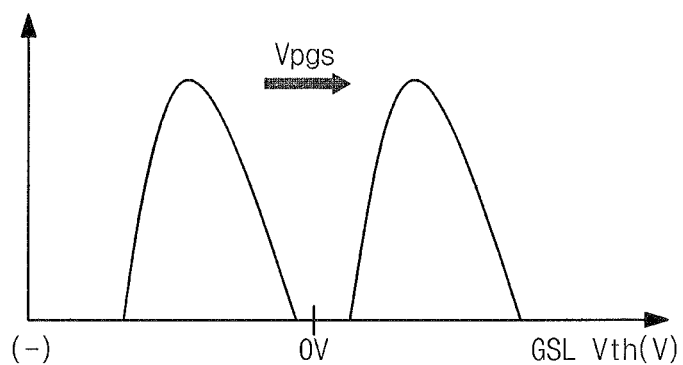
FIG. 15 is a diagram illustrating a shift of a threshold voltage of a ground selection transistor according to the gate stress of a read operation, according to an exemplary embodiment of the inventive concept.

FIG. 15 is a diagram illustrating a shift of a threshold voltage of a ground selection transistor according to the gate stress of a read operation, according to an exemplary embodiment of the inventive concept. Referring to FIG. 15, as a gate stress voltage Vpgs is provided, a threshold voltage distribution may be increased from below 0V to above 0V.

Figure 16:
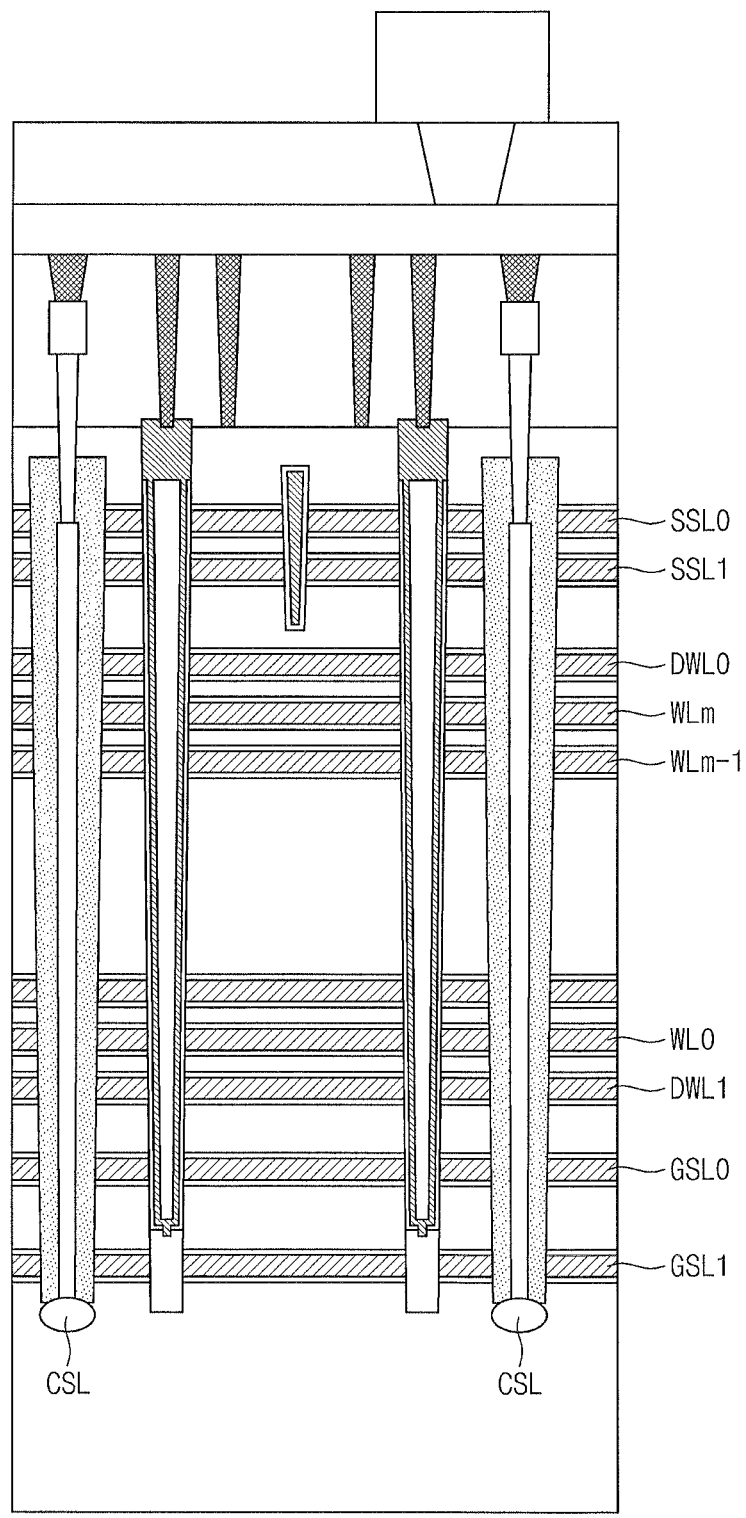
FIG. 16 is a cross-sectional view illustrating ground selection transistors according to an exemplary embodiment of the inventive concept.

FIG. 16 is a cross-sectional view illustrating ground selection transistors according to an exemplary embodiment of the inventive concept. Referring to FIG. 16, a first ground selection transistor GST0 connected with a first ground selection line GSL0 may be formed to have the same structure as a memory cell, and a second ground selection transistor GST1 connected with a second ground selection line GSL1 may be formed using a selective epitaxial growth manner.

As illustrated in FIG. 16, the first ground selection transistor GST0 and the second ground selection transistor GST1 may be controlled by different voltages.

In FIGS. 1 to 16, there may be illustrated an example that a threshold voltage of a ground selection transistor is adjusted via at least one read bias condition. However, the inventive concept is not limited thereto. For example, a threshold voltage of a string selection transistor can be adjusted via at least one read bias condition. Further, a threshold voltage of a ground/string selection transistor can be adjusted via at least one program bias condition.

Exemplary embodiments of the inventive concept are applicable to various devices.

Figure 17:
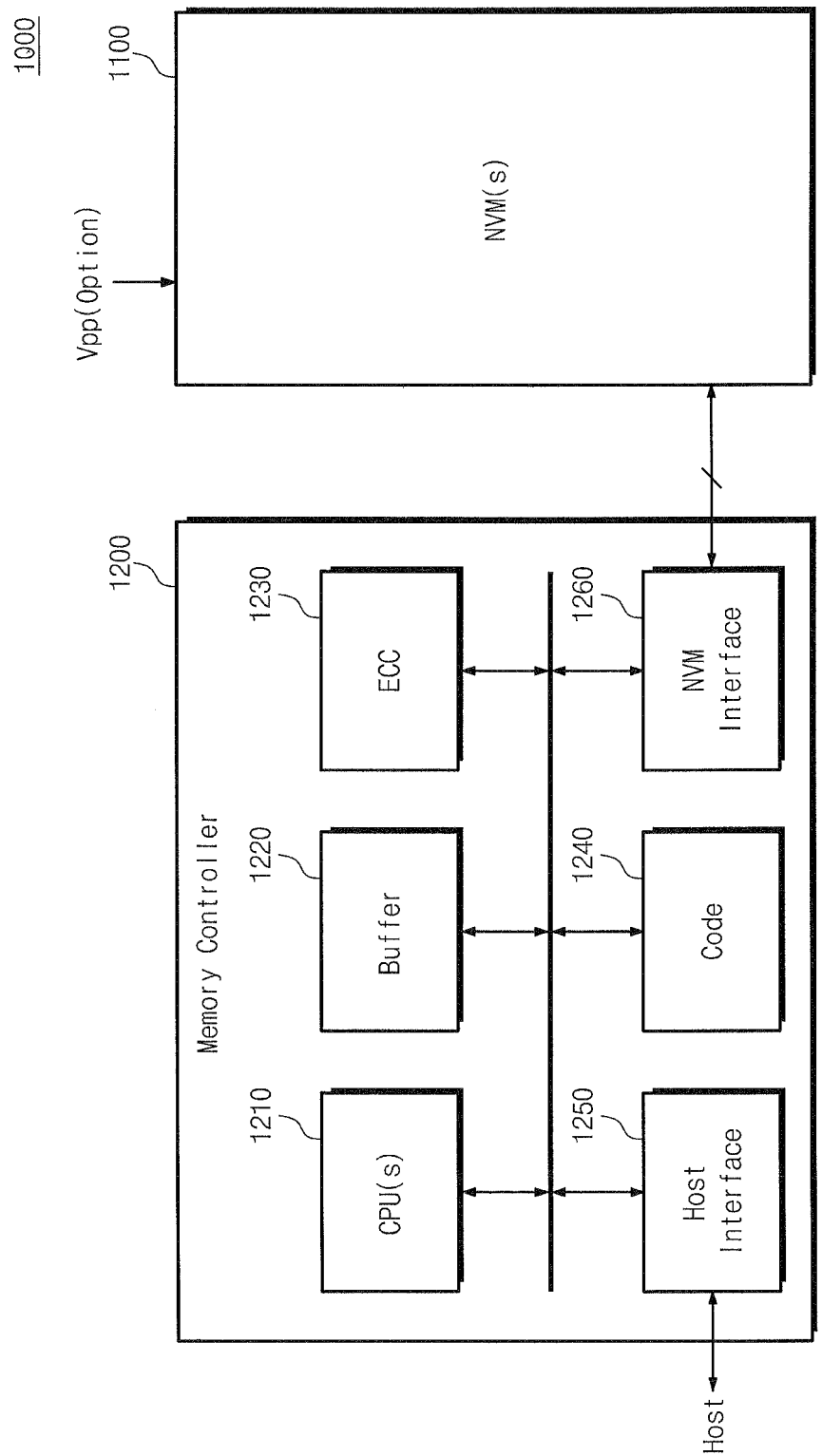
FIG. 17 is a block diagram illustrating a memory system according to an exemplary embodiment of the inventive concept.

FIG. 17 is a block diagram illustrating a memory system according to an exemplary embodiment of the inventive concept. Referring to FIG. 17, a memory system 1000 may include at least one nonvolatile memory device 1100 and a memory controller 1200. The memory system 1000 may adjust a threshold voltage of a ground selection transistor using at least one read bias condition as described with reference to FIGS. 1 to 16.

The nonvolatile memory device 1100 may be optionally provided with a high voltage Vpp from an external device. The memory controller 1200 may be connected with the nonvolatile memory device 1100 via a plurality of channels. The memory controller 1200 may include at least one Central Processing Unit (CPU) 1210, a buffer memory 1220, an error checking and correcting (ECC) circuit 1230, a Code Memory 1240, a host interface 1250 for interfacing with a host, and a memory interface 1260. Although not shown in FIG. 17, the memory controller 1200 may further comprise a randomization circuit that randomizes and de-randomizes data. The memory system 1000 according to an exemplary embodiment of the inventive concept is applicable to a perfect page new (PPN) memory.

A detailed description of a memory system is disclosed in U.S. Pat. No. 8,027,194 and U.S. Patent Application Publication No. 2010/0082890, the disclosures of which are incorporated by reference herein in their entireties.

Figure 18:
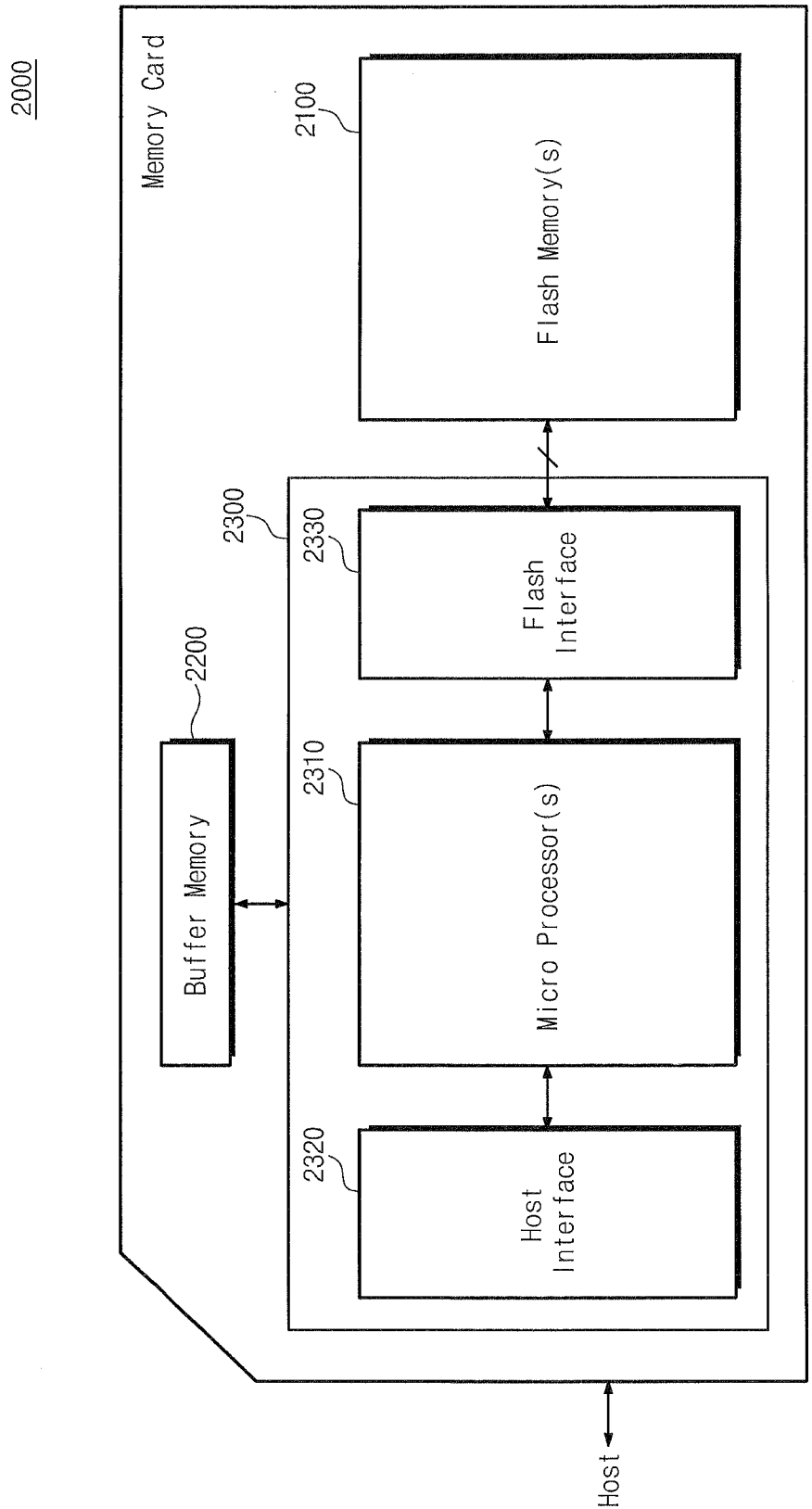
FIG. 18 is a block diagram illustrating a memory card according to an exemplary embodiment of the inventive concept.

FIG. 18 is a block diagram illustrating a memory card according to an exemplary embodiment of the inventive concept. Referring to FIG. 18, a memory card 2000 may include at least one flash memory 2100, a buffer memory device 2200, and a memory controller 2300 for controlling the flash memory 2100 and the buffer memory device 2200. The memory card 2000 may adjust a threshold voltage of a ground selection transistor using at least one read bias condition as described with reference to FIGS. 1 to 16.

The buffer memory device 2200 may be used to temporarily store data generated during the operation of the memory card 2000. The buffer memory device 2200 may be implemented using a dynamic random-access memory (DRAM) or a static random-access memory (SRAM). The memory controller 2300 may be connected with the flash memory 2100 via a plurality of channels. The memory controller 2300 may be connected between a host and the flash memory 2100. The memory controller 2300 may be configured to access the flash memory 2100 in response to a request from the host.

The memory controller 2300 may include at least one microprocessor 2310, a host interface 2320, and a flash interface 2330. The microprocessor 2310 may be configured to drive firmware. The host interface 2320 may interface with the host via a card protocol (e.g., SD/MMC) for data exchanges between the host and the memory card 2000. The memory card 2000 is applicable to Multimedia Cards (MMCs), Secure Digital (SD), miniSDs, memory sticks, smartmedia, and transflash cards.

A detailed description of a memory card is disclosed in U.S. Patent Application Publication No. 2010/0306583, the disclosure of which is incorporated by reference herein in its entirety.

Figure 19:
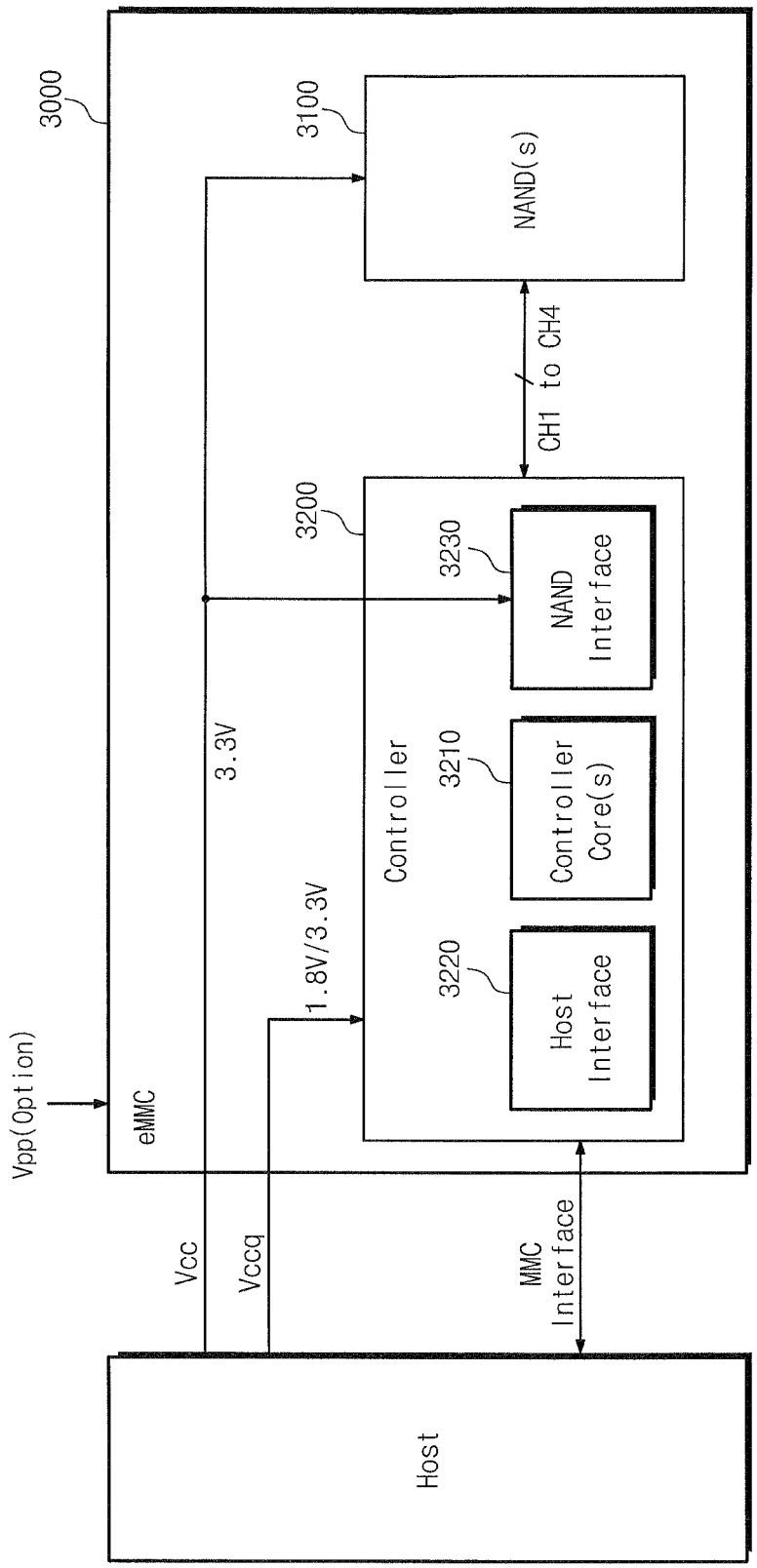
FIG. 19 is a block diagram illustrating a moviNAND according to an exemplary embodiment of the inventive concept.

FIG. 19 is a block diagram illustrating a moviNAND according to an exemplary embodiment of the inventive concept. Referring to FIG. 19, a moviNAND device 3000 may support the MMC 4.4 (or, eMMC) standard. The moviNAND device 3000 may adjust a threshold voltage of a ground selection transistor using at least one read bias condition as described with reference to FIGS. 1 to 16.

The moviNAND 3000 may be optionally provided with a high voltage Vpp from an external device and may include a NAND flash memory device 3100 and controller 3200. The NAND flash memory device 3100 may be a single data rate (SDR) NAND flash memory device or a double data rate (DDR) NAND flash memory device. In an exemplary embodiment of the inventive concept, the NAND flash memory device 3100 may include NAND flash memory chips. Herein, the NAND flash memory device 3100 may be implemented by stacking the NAND flash memory chips in a package (e.g., a fine ball grid array (FBGA), fine-pitch ball grid array, etc.).

The controller 3200 may be connected with the flash memory device 3100 via a plurality of channels CH1 to CH4. However, the number of channels is not limited thereto. The controller 3200 may include at least one controller core 3210, a host interface 3220, and a NAND interface 3230. The controller core 3210 may control an overall operation of the moviNAND device 3000.

The host interface 3220 may be configured to perform an MMC interface between the controller 3200 and a host. The NAND interface 3230 may be configured to interface between the NAND flash memory device 3100 and the controller 3200. In an exemplary embodiment of the inventive concept, the host interface 3220 may be a parallel interface (e.g., an MMC interface). In an exemplary embodiment of the inventive concept, the host interface 3220 of the moviNAND device 3000 may be a serial interface (e.g., ultra high speed (UHS)-II, universal flash storage (UFS), etc.).

The moviNAND device 3000 may receive power supply voltages Vcc and Vccq from the host. Herein, the power supply voltage Vcc (about 3.3V) may be supplied to the NAND flash memory device 3100 and the NAND interface 3230, while the power supply voltage Vccq (about 1.8V/3.3V) may be supplied to the controller 3200.

The moviNAND device 3000 according to an exemplary embodiment of the inventive concept may store mass data and may have a good read characteristic. The moviNAND device 3000 according to an exemplary embodiment of the inventive concept is applicable to small and low-power mobile products (e.g., a Galaxy S, iPhone, etc.).

The moviNAND device 3000 illustrated in FIG. 19 may be supplied with a plurality of the power supply voltages Vcc and Vccq. However, the inventive concept is not limited thereto. The moviNAND device 3000 can be configured to generate a power supply voltage of 3.3V suitable for a NAND interface and a NAND flash memory by boosting or regulating the power supply voltage Vcc internally. Internal boosting or regulating is disclosed in U.S. Pat. No. 7,092,308, the disclosure of which is incorporated by reference herein in its entirety.

Exemplary embodiments of the inventive concept are applicable to a solid state drive (SSD).

Figure 20:
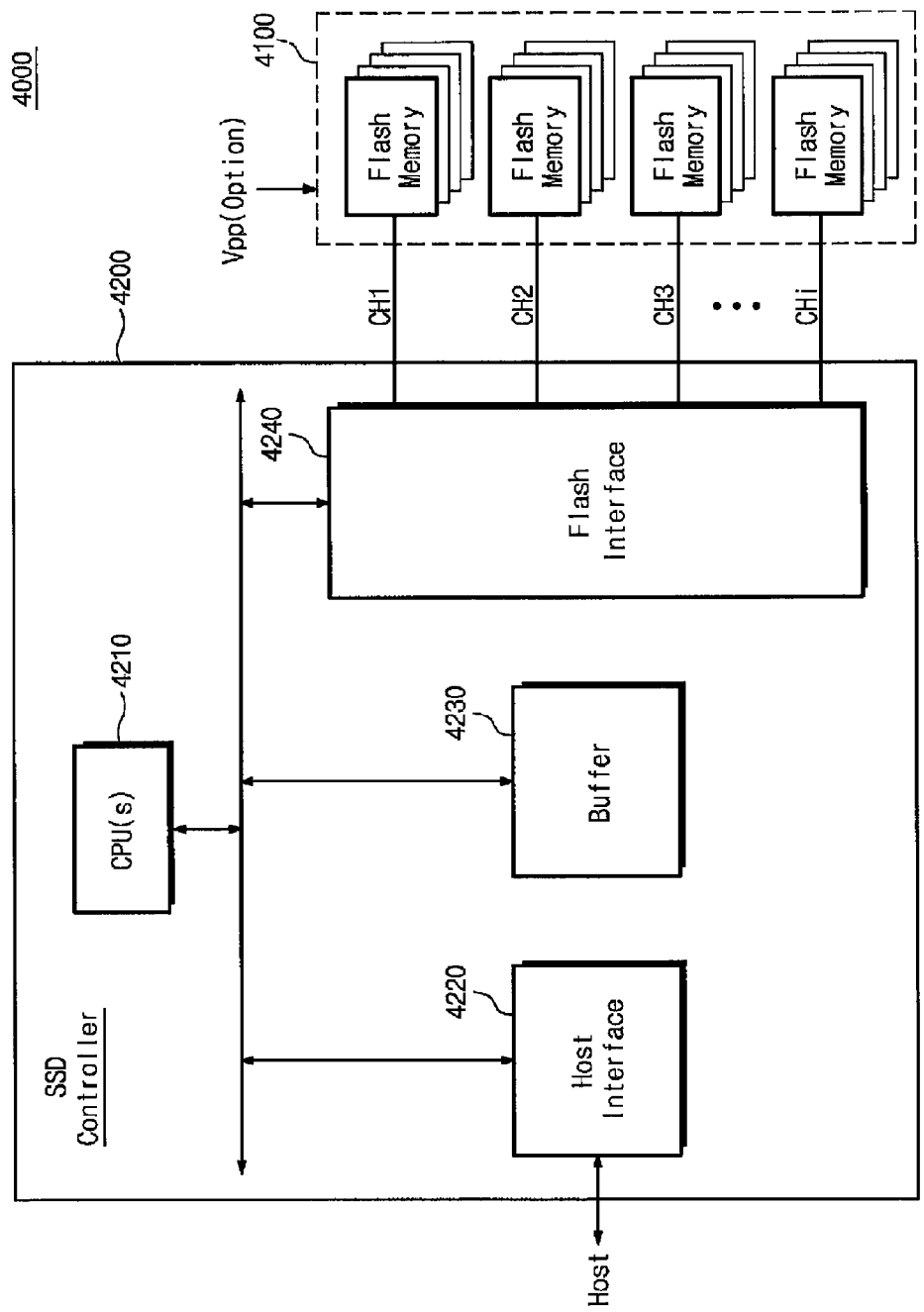
FIG. 20 is a block diagram illustrating a solid state drive (SSD) according to an exemplary embodiment of the inventive concept.

FIG. 20 is a block diagram illustrating an SSD according to an exemplary embodiment of the inventive concept. Referring to FIG. 20, an SSD 4000 may include a plurality of flash memory devices 4100 and an SSD controller 4200. The SSD 4000 may adjust a threshold voltage of a ground selection transistor using at least one read bias condition as described with reference to FIGS. 1 to 16.

In an exemplary embodiment of the inventive concept, each of the flash memory devices 4100 may be optionally provided with an external high voltage Vpp.

The SSD controller 4200 may be connected to the flash memory devices 4100 via a plurality of channels CH1 to CHi. The SSD controller 4200 may include at least one CPU 4210, a host interface 4220, a buffer memory 4230, and a flash interface 4240.

Under the control of the CPU 4210, the host interface 4220 may exchange data with a host through a communication protocol. In an exemplary embodiment of the inventive concept, the communication protocol may include the Advanced Technology Attachment (ATA) protocol. The ATA protocol may include a Serial Advanced Technology Attachment (SATA) interface, a Parallel Advanced Technology Attachment (DATA) interface, an External SATA (ESATA) interface, and the like. In an exemplary embodiment of the inventive concept, the communication protocol may include the Universal Serial Bus (UBS) protocol. Data to be received from or transmitted to the host through the host interface 4220 may be delivered through the buffer memory 4230 without passing through a CPU bus, under the control of the CPU 4210.

The buffer memory 4230 may be used to temporarily store data transferred between an external device and the flash memory devices 4100. The buffer memory 4230 can be used to store programs to be executed by the CPU 4210. The buffer memory 4230 may be implemented using an SRAM or a DRAM. The buffer memory 4230 in FIG. 20 may be included within the SSD controller 4200. However, the inventive concept is not limited thereto. The buffer memory 4230 according to an exemplary embodiment of the inventive concept can be provided outside of the SSD controller 4200.

The flash interface 4240 may be configured to interface between the SSD controller 4200 and the flash memory devices 4100 that are used as storage devices. The flash interface 4240 may be configured to support NAND flash memories, One-NAND flash memories, multi-level flash memories, or single-level flash memories.

The SSD 400 according to an exemplary embodiment of the inventive concept may improve the reliability of data by storing random data at a program operation. A more detailed description of an SSD is disclosed in U.S. Pat. No. 8,027,194 and U.S. Patent Application Publication Nos. 2007-0106836 and 2010-0082890, the disclosures of which are incorporated by reference herein in their entireties.

Figure 21:
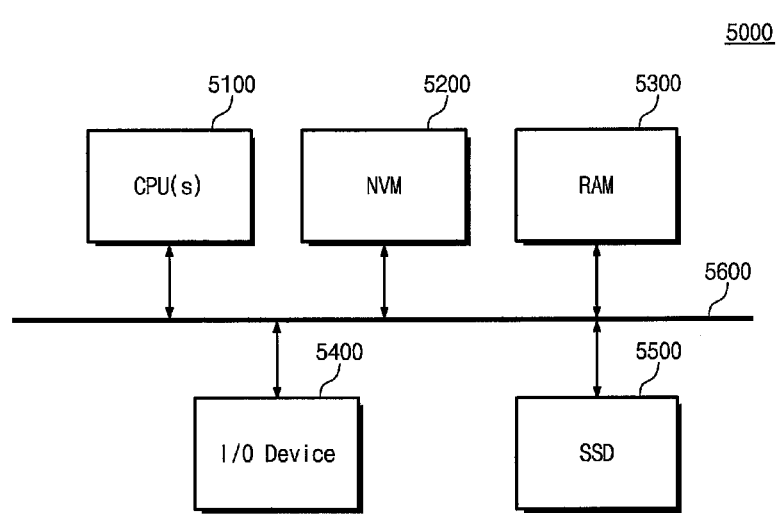
FIG. 21 is a block diagram illustrating a computing system including an SSD according to an exemplary embodiment of the inventive concept.

FIG. 21 is a block diagram illustrating a computing system including an SSD according to an exemplary embodiment of the inventive concept. Referring to FIG. 21, a computing system 5000 may include at least one CPU 5100, a nonvolatile memory device 5200, a RAM 5300, an input/output (I/O) device 5400, and an SSD 5500.

The CPU 5100 may be connected to a system bus 5600. The nonvolatile memory device 5200 may store data used to drive the computing system 5000. Herein, the data may include a start command sequence or a basic I/O system (BIOS) sequence. The RAM 5300 may temporarily store data generated during the execution of the CPU 5100. The I/O device 5400 may be connected to the system bus 5600 through an I/O device interface such as keyboards, pointing devices (e.g., mouse), monitors, modems, and the like. The SSD 5500 may be a readable storage device and may be implemented like the SSD 4000 of FIG. 20.

Figure 22:
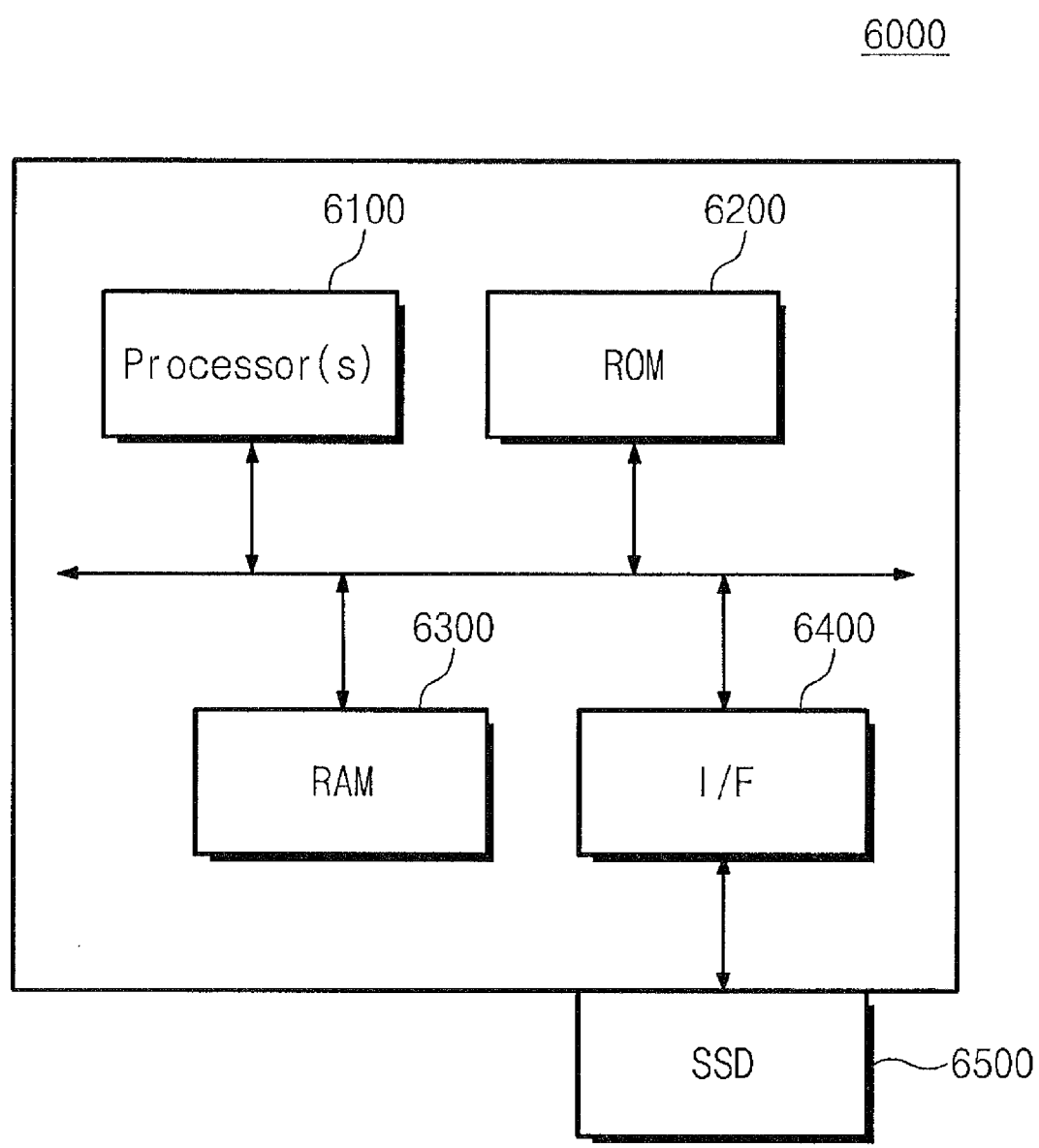
FIG. 22 is a block diagram illustrating an electronic device including an SSD according to an exemplary embodiment of the inventive concept.

FIG. 22 is a block diagram illustrating an electronic device including an SSD according to an exemplary embodiment of the inventive concept. Referring to FIG. 22, an electronic device 6000 may include a processor 6100, a ROM 6200, a RAM 6300, a flash interface 6400, and at least one SSD 6500.

The processor 6100 may access the RAM 6300 to execute firmware codes or other codes. In addition, the processor 6100 may access the ROM 6200 to execute fixed command sequences such as a start command sequence and a BIOS sequence. The flash interface 6400 may be configured to interface between the electronic device 6000 and the SSD 6500. The SSD 6500 may be detachable from the electronic device 6000. The SSD 6500 may be implemented like the SSD 4000 of FIG. 20.

The electronic device 6000 may include cellular phones, personal digital assistants (PDAs), digital cameras, camcorders, portable audio players (e.g., MP3), and portable media players (PMPs).

Figure 23:
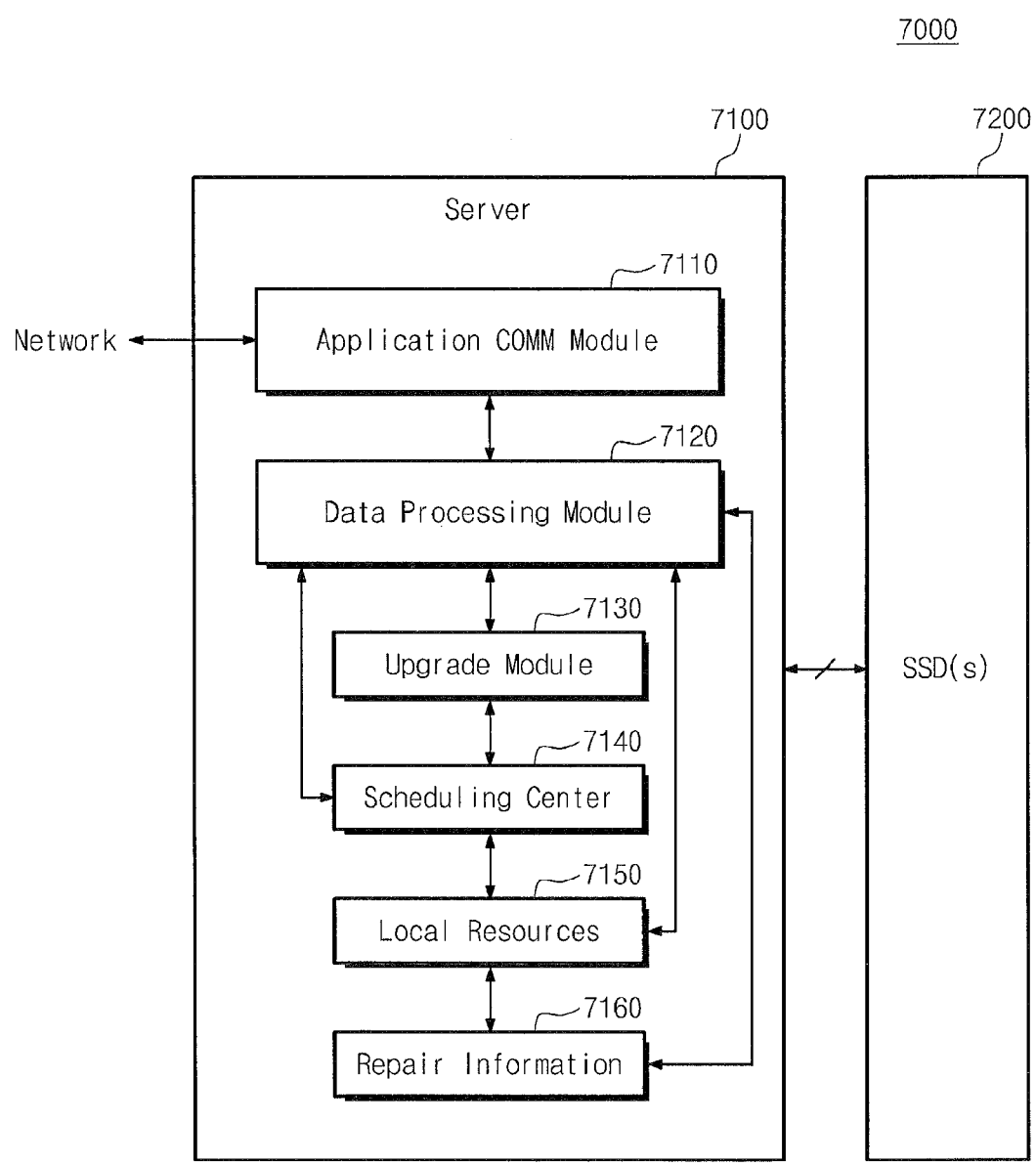
FIG. 23 is a block diagram illustrating a server system including an SSD according to an exemplary embodiment of the inventive concept.

FIG. 23 is a block diagram illustrating a server system including an SSD according to an exemplary embodiment of the inventive concept. Referring to FIG. 23, a server system 7000 may include a server 7100 and at least one SSD 7200 that stores data used to drive the server 7100. The SSD 7200 may be configured like the SSD 4000 of FIG. 20.

The server 7100 may include an application communication module 7110, a data processing module 7120, an upgrade module 7130, a scheduling center 7140, a local resource module 7150, and a repair information module 7160. The application communication module 7110 may be configured to communicate with a computing system connected to a network and the server 7100, or to allow the server 7100 to communicate with the SSD 7200. The application communication module 7110 may transmit data or information, provided through a user interface, to the data processing module 7120.

The data processing module 7120 may be linked to the local resource module 7150. Here, the local resource module 7150 may provide a list of repair shops/dealers/technical information to a user on the basis of information or data inputted to the server 7100. The upgrade module 7130 may interface with the data processing module 7120. Based on information or data received from the SSD 7200, the upgrade module 7130 may perform upgrades of a firmware, a reset code, a diagnosis system, or other information on electronic appliances.

The scheduling center 7140 may provide real-time options to the user based on the information or data inputted to the server 7100. The repair information module 7160 may interface with the data processing module 7120. The repair information module 7160 may be used to provide repair-related information (e.g., audio, video, or document files) to the user. The data processing module 7120 may package information related to the information received from the SSD 7200. The packaged information may be transmitted to the SSD 7200 or may be displayed to the user.

Exemplary embodiments of the inventive concept are applicable to mobile products (e.g., Galaxy S, iPhone, etc.).

Figure 24:
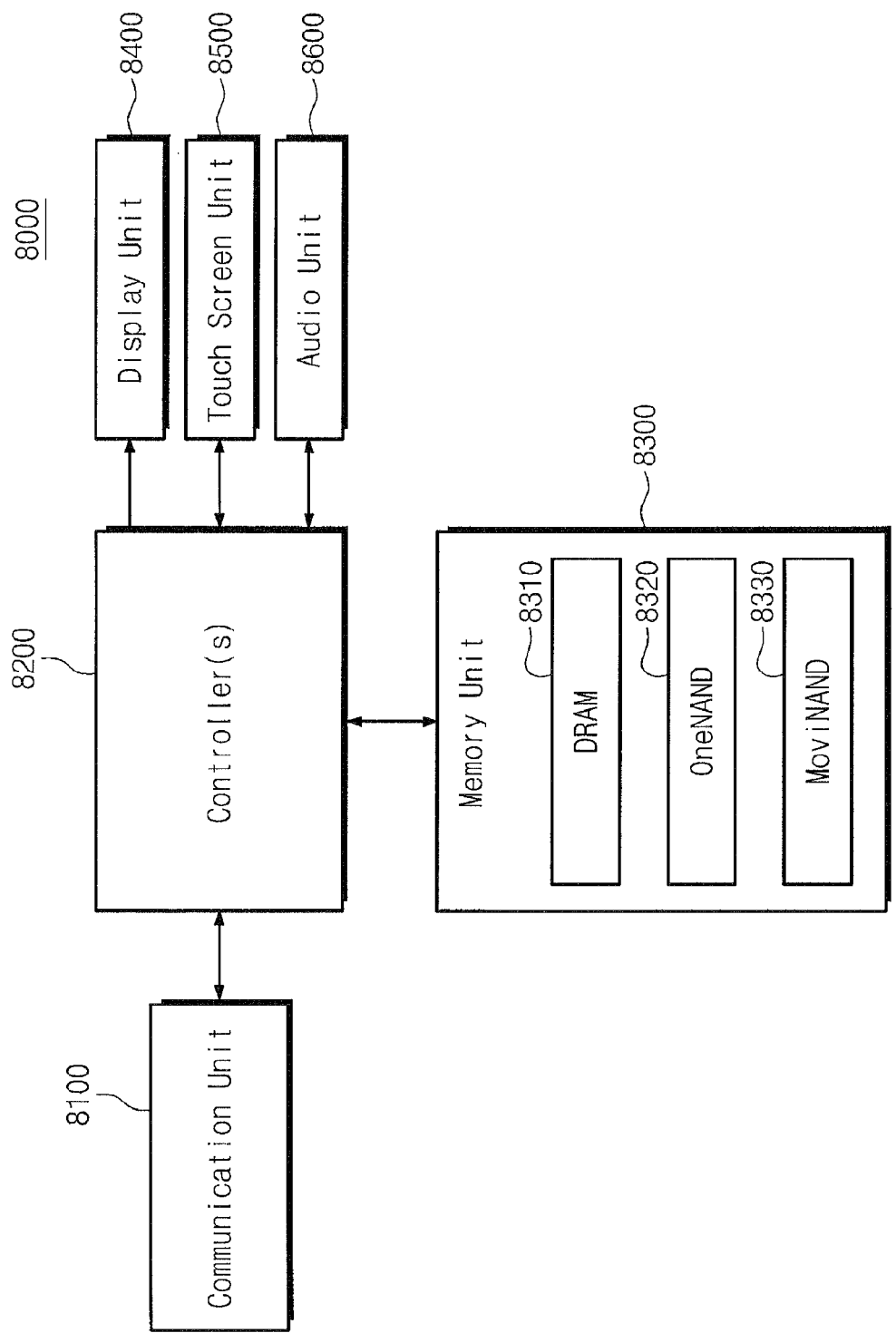
FIG. 24 is a block diagram illustrating a mobile device according to an exemplary embodiment of the inventive concept.

FIG. 24 is a block diagram illustrating a mobile device according to an exemplary embodiment of the inventive concept. Referring to FIG. 24, a mobile device 8000 may include a communication unit 8100, a controller 8200, a memory unit 8300, a display unit 8400, a touch screen unit 8500, and an audio unit 8600.

The memory unit 8300 may include at least one DRAM 8310, at least one OneNAND 8320, and at least one moviNAND 8330. At least one of the OneNAND 8320 and the moviNAND 8330 may adjust a threshold voltage of a ground selection transistor using at least one read bias condition as described with reference to FIGS. 1 to 16.

A detailed description of a mobile device is disclosed in U.S. Patent Application Publication Nos. 2010-0110040, 2010-0062715, 2010-0309237, and 2010-0315325, the disclosures of which are incorporated by reference herein in their entireties.

Exemplary embodiments of the inventive concept are applicable to tablet products (e.g., Galaxy Tab, iPad, etc.).

Figure 25:
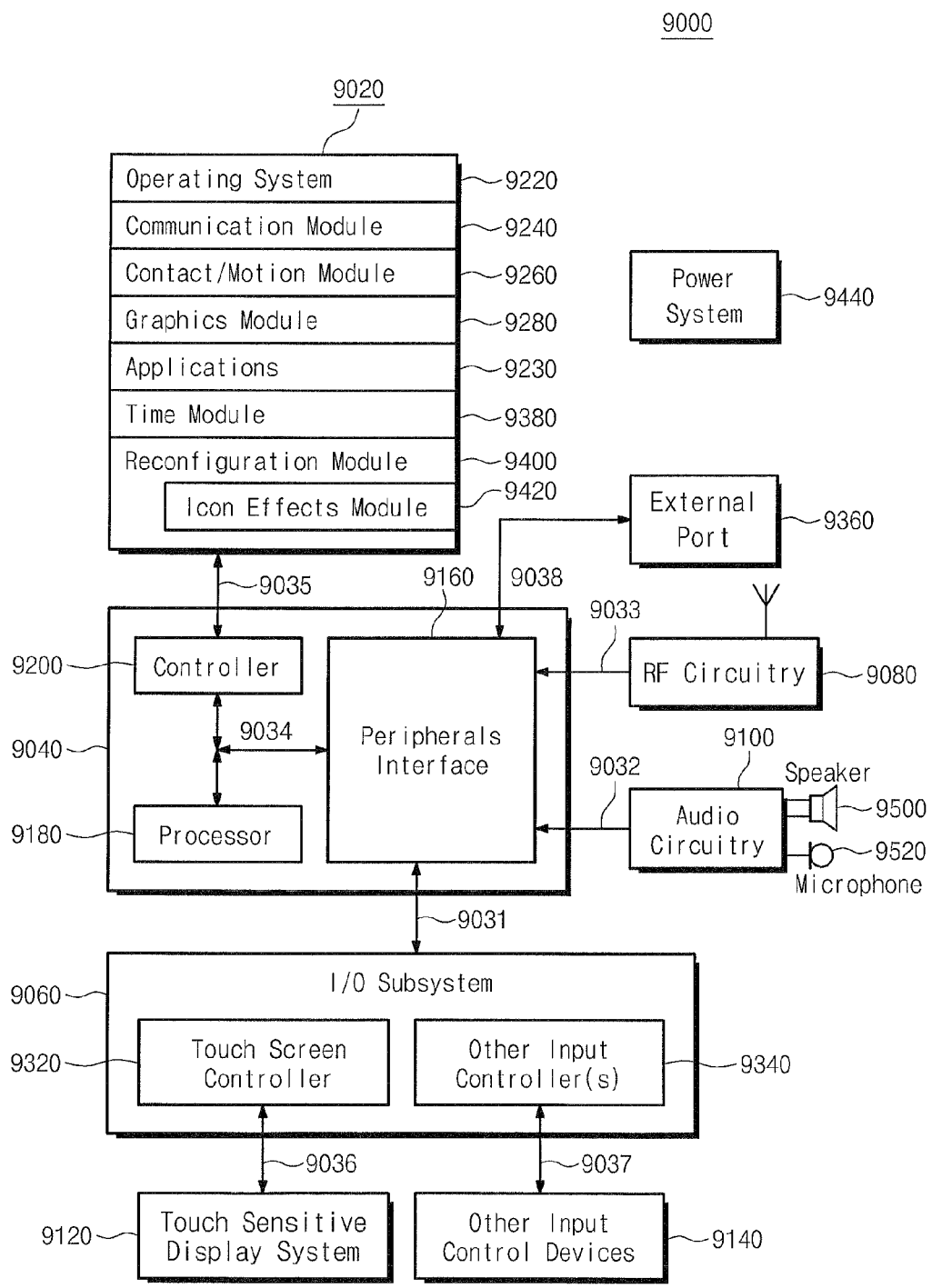
FIG. 25 is a block diagram illustrating a handheld electronic device according to an exemplary embodiment of the inventive concept.

FIG. 25 is a block diagram illustrating a handheld electronic device according to an exemplary embodiment of the inventive concept. Referring to FIG. 25, a handheld electronic device 9000 may include at least one computer-readable media 9020, a processing system 9040, an input/output subsystem 9060, a radio frequency circuit 9080, and an audio circuit 9100. Elements of the handheld electronic device 9000 can be interconnected by at least one communication bus or signal lines 9031-9038.

The computer-readable media 9020 may include an operating system 9220, a communication module 9240, a contact/motion module 9260, a graphics module 9280, applications 9230, a time module 9380 and a reconfiguration module 9400 that includes an icon effects module 9420. The processing system 9040 may include a controller 9200, processor 9180 and peripherals interface 9160. The processing system 9040 may be connected to an external port 9360. The audio circuit 9100 may include a speaker 9500 and microphone 9520. The I/O subsystem 9060 may include a touch screen controller 9320 and other input controller(s) 9340. A touch sensitive display system 9120 may be connected to the touch screen controller 9320 and other input control devices 9140 may be connected to the other input controllers 9340. The handheld electronic device 9000 may further include a power system 9440.

The handheld electronic device 9000 may be a portable electronic device including a handheld computer, a tablet computer, a cellular phone, a media player, a PDA, or a combination of two or more thereof. Herein, the at least one computer-readable media 9020 may adjust a threshold voltage of a ground selection transistor using at least one read bias condition as described with reference to FIGS. 1 to 16. A detailed description of a handheld electronic device is disclosed in U.S. Pat. No. 7,509,588, the disclosure of which is incorporated by reference herein in its entirety.

A memory system or a storage device according to an exemplary embodiment of the inventive concept may be mounted in various types of packages. Examples of the packages of the memory system or the storage device according to an exemplary embodiment of the inventive concept may include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

While the inventive concept has been shown and described with reference to exemplary embodiments thereof, it will be apparent to those of ordinary skill in the art that various changes in form and detail may be made thereto without departing from the spirit and scope of the inventive concept as defined by the following claims.

What is claimed is:

1. A method of adjusting a threshold voltage of a ground selection transistor in a nonvolatile memory device, the method comprising:
   providing a first voltage to a gate of a first ground selection transistor in a read operation; and
   providing a second voltage to a gate of a second ground selection transistor in the read operation, wherein the nonvolatile memory device includes at least one string, the string having string selection transistors, memory cells and the first and second ground selection transistors connected in series and stacked on a substrate.

2. The method of claim 1, wherein the second ground selection transistor is formed on the substrate and the first ground selection transistor is formed on the second ground selection transistor.

3. The method of claim 2, wherein the first and second ground selection transistors are formed by ion implantation.

4. The method of claim 2, wherein the first voltage is higher than a read pass voltage.

5. The method of claim 4, wherein the first voltage is lower than a maximum value of a program voltage.

6. The method of claim 4, wherein a read operation of a selected memory cell is performed by providing a pre-charge voltage to a bit line connected to the string, the read pass voltage to a string selection line connected with a gate of a selected one of the string selection transistors, a read voltage to a word line connected with the selected memory cell, the read pass voltage to word lines connected with unselected word lines of the word lines, the first voltage to a first ground selection line connected with the gate of the first ground selection transistor, and the second voltage to a second ground selection line connected with the gate of the second ground selection transistor.

7. The method of claim 6, wherein the second voltage is higher than the read pass voltage.

8. The method of claim 6, wherein the second voltage is the read pass voltage.

9. The method of claim 6, wherein the read operation of the selected memory cell is repeated.

10. The method of claim 4, wherein voltages applied to a bit line connected to the string, string selection lines connected with gates of the string selection lines, and word lines connected with the memory cells have a don't care state, and the second voltage is higher than a read pass voltage and lower than a program voltage.

11. The method of claim 4, wherein voltages applied to a bit line connected to the string, string selection lines connected with gates of the string selection lines, and word lines connected with the memory cells have a don't care state, and the second voltage is a read pass voltage.

12. The method of claim 1, further comprising:
    determining whether a threshold voltage of the first ground selection transistor is adjusted.

13. A nonvolatile memory device, comprising:
    a memory cell array having a plurality of memory blocks, at least one of the memory blocks including at least one string having string selection transistors, memory cells, and first and second ground selection transistors connected in series and formed on a substrate;
    a read/write circuit configured to read data from or write data to the memory cell array;
    an address decoder configured to generate a block selection signal in response to an address;
    a block gating circuit configured to select one of the plurality of memory blocks in response to the block selection signal; and
    control logic configured to control the read/write circuit, the address decoder, and the block gating circuit,
    wherein the control logic adjusts a threshold voltage of at least one of the first and second ground selection transistors by providing a first voltage to a gate of the first ground selection transistor and a second voltage to a gate of the second ground selection transistor in a read operation.

14. The nonvolatile memory device of claim 13, further comprising:
    at least one first dummy cell connected between the string selection transistors and the memory cells; and at least one second dummy cell connected between the memory cells and the first and second ground selection transistors.

15. The nonvolatile memory device of claim 13, wherein the first ground selection transistor has the same structure as at least one of the memory cells and the second ground selection transistor has a different structure than the first ground selection transistor.

* * * * *